US010203169B2

(12) United States Patent
Ghioni et al.

(10) Patent No.: US 10,203,169 B2
(45) Date of Patent: Feb. 12, 2019

(54) THERMAL MANAGEMENT DEVICES, SYSTEMS AND METHODS

(71) Applicant: Microsoft Technology Licensing, LLC, Redmond, WA (US)

(72) Inventors: Lincoln Matthew Ghioni, Redmond, WA (US); Shi Luo, Pasadena, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/619,777

(22) Filed: Jun. 12, 2017

(65) Prior Publication Data
US 2018/0356168 A1 Dec. 13, 2018

(51) Int. Cl.
| H01L 23/34 | (2006.01) |
| H01L 23/36 | (2006.01) |
| H01L 23/42 | (2006.01) |
| F28F 13/18 | (2006.01) |
| H01L 23/367 | (2006.01) |
| H01L 23/00 | (2006.01) |
| H01L 23/427 | (2006.01) |
| C25D 11/02 | (2006.01) |
| B82Y 30/00 | (2011.01) |

(52) U.S. Cl.
CPC ............ F28F 13/185 (2013.01); H01L 23/34 (2013.01); H01L 23/367 (2013.01); H01L 23/427 (2013.01); H01L 24/31 (2013.01); B82Y 30/00 (2013.01); C25D 11/02 (2013.01)

(58) Field of Classification Search
CPC ..... H01L 23/34; H01L 23/367; H01L 23/427; H01L 24/31; F28F 13/185
See application file for complete search history.

(56) References Cited

U.S. PATENT DOCUMENTS

| 4,519,442 | A | * | 5/1985 | Barna | C03B 5/237 165/9.1 |
| 5,679,041 | A | * | 10/1997 | Sokol | B22F 3/22 442/59 |
| 6,158,502 | A | * | 12/2000 | Thomas | F28D 15/02 165/104.26 |
| 7,650,931 | B2 | * | 1/2010 | Siu | F28D 15/0233 165/104.26 |
| 8,069,907 | B2 | * | 12/2011 | Bryant | F28D 15/0241 165/104.33 |
| 8,389,177 | B2 | * | 3/2013 | Fly | B29C 67/20 429/475 |

(Continued)

OTHER PUBLICATIONS

Ameli, Masoud, "Advanced 3D printed heat pipes for space applications", http://www.hexag.org/news/30/MASOUD,AMELI.pdf, Published on: May 22, 2013, 37 pages.

(Continued)

*Primary Examiner* — Ida M Soward
(74) *Attorney, Agent, or Firm* — Ray Quinney & Nebeker P.C.; Paul N. Taylor

(57) ABSTRACT

A wicking structure and/or support structure for thermal management is described. The wicking structure and/or structural support may include a plurality of additively manufactured wick unit cells. Each unit cell may include a plurality of struts that have a shell. A thermal management system that includes a wicking structure and/or a support structure is also described.

20 Claims, 28 Drawing Sheets

(56) References Cited

U.S. PATENT DOCUMENTS

| | | | | |
|---|---|---|---|---|
| 8,574,710 B2* | 11/2013 | Coffey | B32B 33/00 |
| | | | 428/304.4 |
| 8,579,018 B1 | 11/2013 | Roper et al. | |
| 8,596,341 B2* | 12/2013 | Tegrotenhuis | F25B 37/00 |
| | | | 165/104.26 |
| 8,650,756 B2* | 2/2014 | Wadley | B21D 47/00 |
| | | | 29/897 |
| 8,657,695 B2* | 2/2014 | Wilson | E01C 13/02 |
| | | | 472/86 |
| 9,017,806 B2* | 4/2015 | Jacobsen | B32B 3/26 |
| | | | 428/304.4 |
| 9,405,067 B2* | 8/2016 | Yang | G02B 6/138 |
| 9,453,604 B1 | 9/2016 | Maloney | F16L 41/00 |
| 9,459,050 B2* | 10/2016 | Zhao | B22F 3/11 |
| 9,546,826 B1* | 1/2017 | Carter | F28D 15/046 |
| 9,728,397 B1* | 8/2017 | Ting | H01L 21/0206 |
| 9,758,382 B1* | 9/2017 | Roper | C01B 31/06 |
| 9,862,151 B1* | 1/2018 | Maloney | B29C 67/202 |
| 2001/0019037 A1* | 9/2001 | Zakhidov | B82Y 20/00 |
| | | | 216/56 |
| 2004/0123980 A1* | 7/2004 | Queheillalt | C23C 14/046 |
| | | | 165/133 |
| 2007/0012429 A1* | 1/2007 | Siu | F28D 15/0233 |
| | | | 165/104.33 |
| 2007/0193029 A1 | 8/2007 | Yeh et al. | |
| 2010/0229394 A1 | 9/2010 | Tsai et al. | |
| 2010/0291401 A1* | 11/2010 | Medina | B23K 15/0086 |
| | | | 428/593 |
| 2010/0300669 A1* | 12/2010 | Jacobsen | F28F 13/003 |
| | | | 165/185 |
| 2011/0200478 A1* | 8/2011 | Billiet | A61F 2/30 |
| | | | 419/2 |
| 2011/0250385 A1* | 10/2011 | Sypeck | B29D 24/00 |
| | | | 428/119 |
| 2012/0312507 A1 | 12/2012 | Yang | |
| 2013/0126132 A1 | 5/2013 | Chen | |
| 2014/0037873 A1* | 2/2014 | Cheung | B32B 3/06 |
| | | | 428/34.1 |
| 2014/0251585 A1* | 9/2014 | Kusuda | F28D 1/06 |
| | | | 165/164 |
| 2015/0289413 A1 | 10/2015 | Rush et al. | |
| 2016/0027425 A1* | 1/2016 | Cook | G10K 11/162 |
| | | | 428/221 |
| 2016/0084578 A1 | 3/2016 | Kusuda | |
| 2016/0088773 A1* | 3/2016 | Greeson | H05K 7/1497 |
| | | | 312/223.2 |
| 2016/0131436 A1 | 5/2016 | Hsieh | |
| 2016/0194070 A1* | 7/2016 | Doty | B32B 3/12 |
| | | | 244/123.1 |
| 2016/0208476 A1* | 7/2016 | Wadley | C23C 8/22 |
| 2017/0014235 A1* | 1/2017 | Jones | A61F 2/2803 |
| 2017/0023084 A1* | 1/2017 | Guest | F16F 7/00 |
| 2017/0108210 A1* | 4/2017 | Meinhart | F22B 1/30 |
| 2017/0167800 A1* | 6/2017 | Sunada | F28D 15/046 |
| 2017/0183870 A1* | 6/2017 | Cheung | E04C 5/0627 |
| 2017/0189922 A9* | 7/2017 | Velasquez-Garcia | B05B 1/14 |
| 2017/0299277 A1* | 10/2017 | Yang | F28D 15/046 |
| 2017/0338167 A1* | 11/2017 | Bozorgi | H01L 23/467 |
| 2018/0058531 A1* | 3/2018 | Schaedler | F16F 7/121 |
| 2018/0064540 A1* | 3/2018 | Hunt | A61F 2/30907 |
| 2018/0187984 A1* | 7/2018 | Manzo | F28F 7/02 |

OTHER PUBLICATIONS

"International Search Report and Written Opinion Issued in PCT Application No. PCT/US2018/034022", dated Sep. 3, 2018, 17 Pages.

* cited by examiner

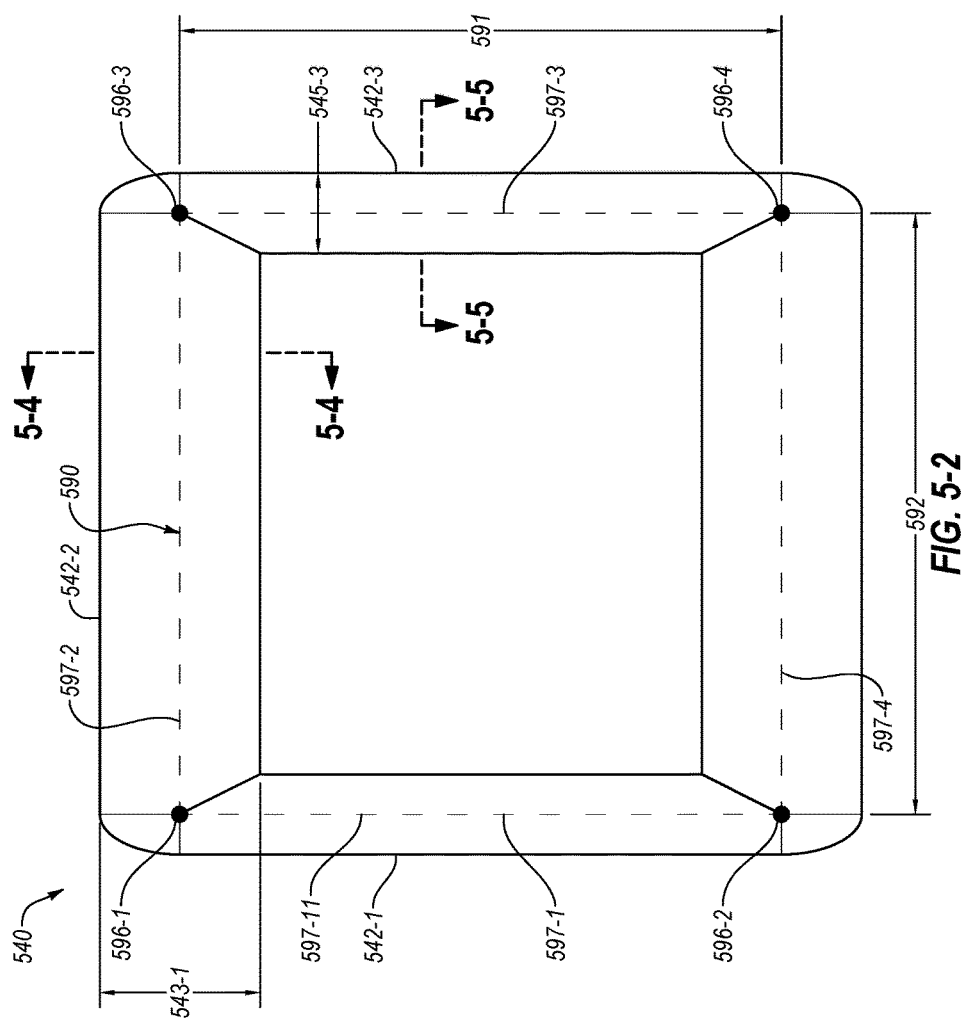

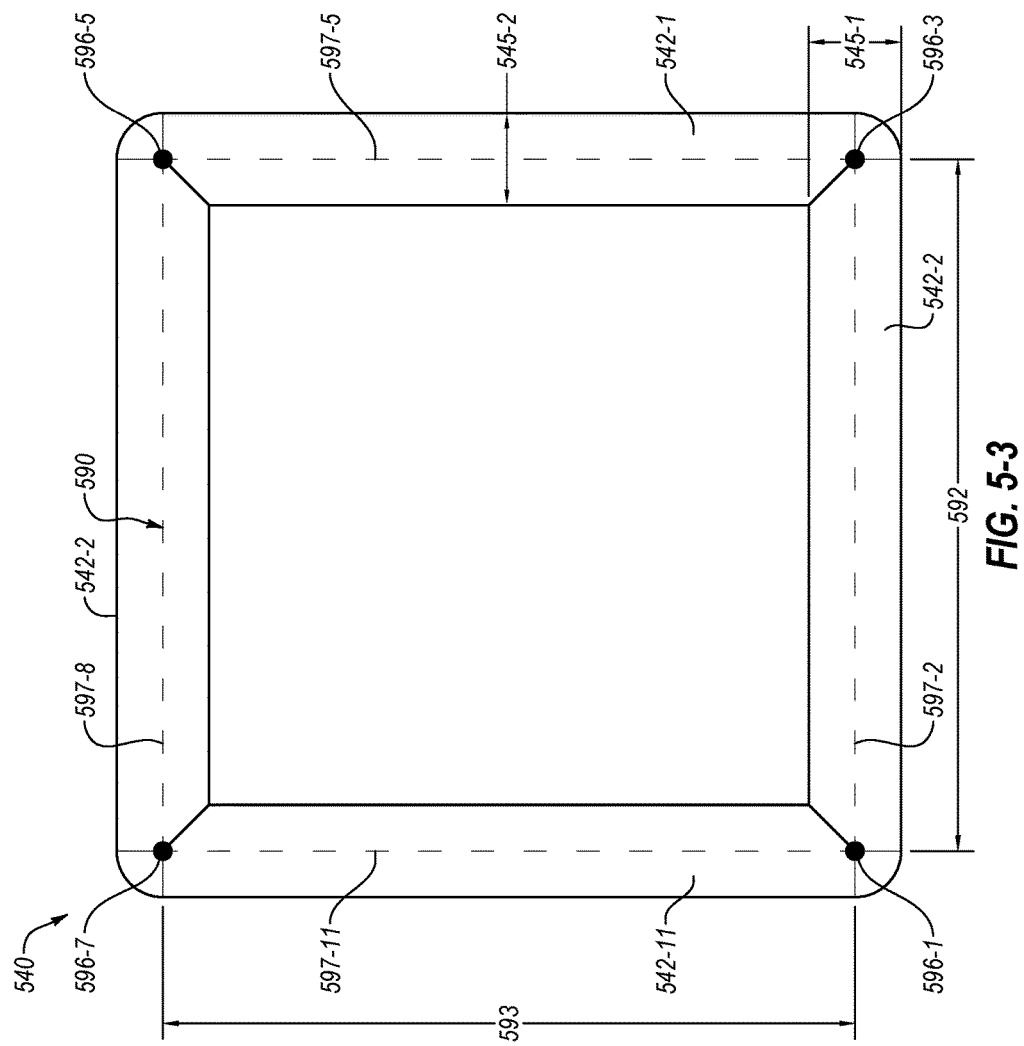

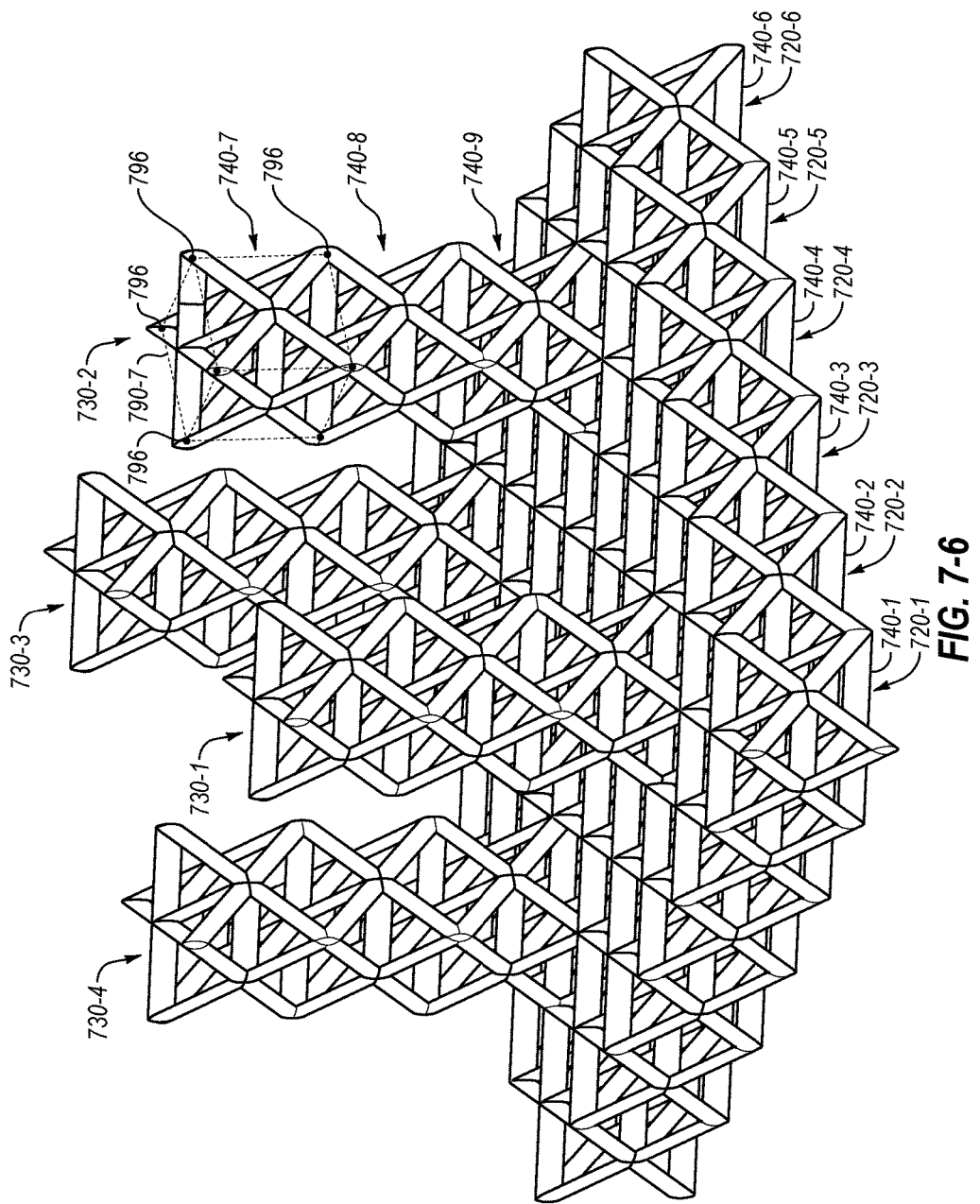

THERMAL MANAGEMENT DEVICES, SYSTEMS AND METHODS

BACKGROUND

Background and Relevant Art

Use of computing devices is becoming more ubiquitous by the day. Computing devices range from standard desktop computers to wearable computing technology and beyond. As technology improves, computing devices continue to decrease in size.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

In one embodiment, a wicking structure for thermal management is described. The wicking structure includes a plurality of additively manufactured wick unit cells. Each unit cell has a plurality of struts including a shell.

In one embodiment, a support structure for thermal management is described. The support structure includes a plurality of additively manufactured support unit cells. Each unit cell has a plurality of struts including a shell.

In one embodiment, a thermal management system is described. The system includes a housing. The system includes a plurality of additively manufactured wick unit cells oriented within the housing. Each wick unit cell has a plurality of struts including a shell. The system includes a plurality of additively manufactured support unit cells extending between an upper interface and a lower interface of the housing. Each unit cell has a plurality of struts including a shell. At least one of the plurality of additively manufacture wick unit cells is connected to at least one of the plurality of additively manufactured support unit cells.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 5-1 is an isometric perspective view of a first embodiment of a unit cell;
FIG. 5-2 is a front view of the embodiment of a unit cell of FIG. 5-1;
FIG. 5-3 is a top view of the embodiment of a unit cell of FIG. 5-1;
FIG. 5-4 is a cross-sectional view of a first strut of the embodiment of a unit cell of FIG. 5-1;
FIG. 5-5 is a cross-sectional view of a third strut of the embodiment of a unit cell of FIG. 5-1;
FIG. 6-1 is an isometric perspective view of a first embodiment of a plurality of wicking structures and support structures;
FIG. 6-2 is a front view of the embodiment of a plurality of wicking structures and support structures, of FIG. 6-1;
FIG. 6-3 is a bottom view of the embodiment of a plurality of wicking structures and support structures, of FIG. 6-1;
FIG. 7-1 is an isometric perspective view of a second embodiment of a unit cell;
FIG. 7-2 is a front view of the embodiment of a unit cell of FIG. 7-1;
FIG. 7-3 is a top view of the embodiment of a unit cell of FIG. 7-1;
FIG. 7-4 is a cross-sectional view of a first strut of the embodiment of a unit cell of FIG. 7-1;
FIG. 7-5 is a cross-sectional view of a third strut of the embodiment of a unit cell of FIG. 7-1;
FIG. 7-6 is an isometric perspective view of a second embodiment of a plurality of wicking structures and support structures using the embodiment of a unit cell of FIGS. 7-1 through 7-3;
FIG. 7-7 is a front view of the embodiment of a plurality of wicking structures and support structures, of FIG. 7-6;
FIG. 7-8 is a bottom view of the embodiment of a plurality of wicking structures and support structures, of FIG. 7-6;
FIG. 8-1 is an isometric perspective view of a third embodiment of a unit cell;
FIG. 8-2 is a front view of the embodiment of a unit cell of FIG. 8-1;
FIG. 8-3 is a top view of the embodiment of a unit cell of FIG. 8-1;
FIG. 8-4 is a cross-sectional view of a first strut of the embodiment of a unit cell of FIG. 8-1;
FIG. 8-5 is a cross-sectional view of a third strut of the embodiment of a unit cell of FIG. 8-1;
FIG. 9-1 is an isometric perspective view of a fourth embodiment of a plurality of wicking structures and a plurality of support structures;
FIG. 9-2 is a front view of the embodiment of a plurality of wicking structures and support structures, of FIG. 9-1;
FIG. 9-3 is a bottom view of the embodiment of a plurality of wicking structures and support structures, of FIG. 9-1;
FIG. 10-1 is an isometric perspective view of a fifth embodiment of a plurality of wicking structures and a plurality of support structures;
FIG. 10-2 is a front view of the embodiment of a plurality of wicking structures and support structures, of FIG. 10-1;

FIGS. 11-1 is an isometric perspective view of a fourth embodiment of a unit cell;

FIG. 11-2 is a front view of the embodiment of a unit cell of FIG. 11-1;

FIG. 11-3 is a top view of the embodiment of a unit cell of FIG. 11-1; and

FIG. 11-4 is a cross-sectional view of a first strut of the embodiment of a unit cell of FIG. 11-1.

DETAILED DESCRIPTION

This disclosure generally relates to thermal management devices, systems and methods. More particularly, this disclosure generally relates to additively manufactured wicking structures, support structures, systems for thermal management and methods of manufacture and use.

Figure 1:
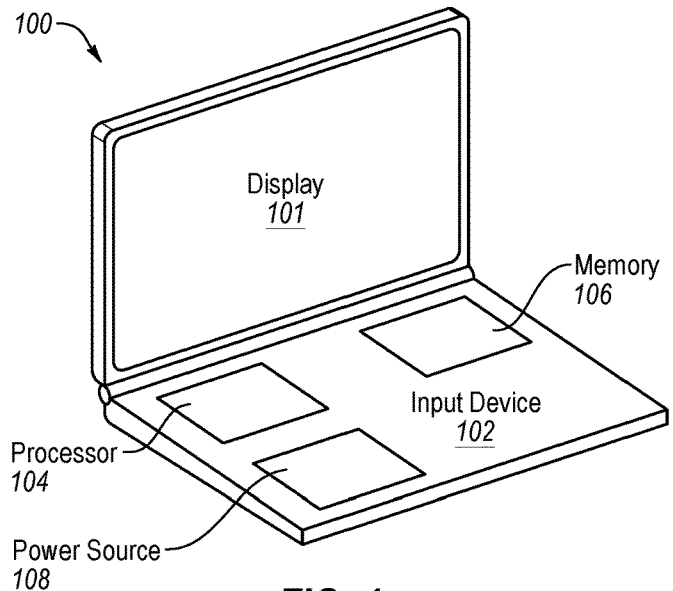
FIG. 1 is a first embodiment of a computing device.

FIG. 1 is a perspective view of an embodiment of a computing device 100 in an open configuration. The computing device 100 is shown as a laptop. In other embodiments, the computing device 100 may be a smartphone (e.g., computing device 200 in FIG. 2, computing device 300 in FIG. 3), a tablet, a watch, a desktop, a game controller, a camera, other computing devices, and accessories therefor. The computing device 100 is shown with a display 101 and an input device 102. The computing device 100 may include a processor 104, memory 106, power source 108, input/output connections, communication devices, other computing components, or combinations thereof. One or more computing components may be found in the display 101 and/or the input device 102.

Figure 2:
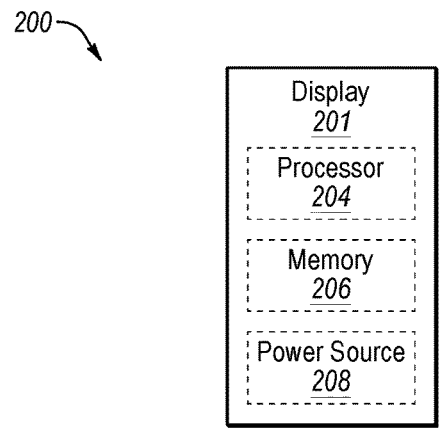
FIG. 2 is a second embodiment of a computing device.

FIG. 2 is a perspective view of an embodiment of a computing device 200 in an open configuration. The computing device 200 is shown as a smartphone. The computing device 200 is shown with a display 201. The display 201 may also function as an input device. The computing device 200 may include a processor 204, memory 206, power source 208, input/output connections, communication devices, other computing components, or combinations thereof. One or more computing components may be found in the display 201.

Figure 3:
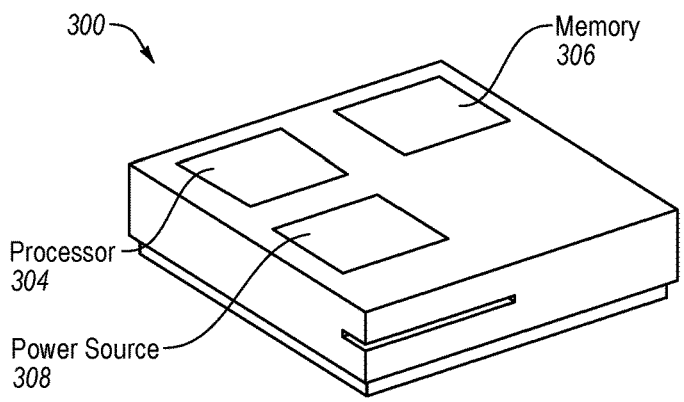
FIG. 3 is a third embodiment of a computing device.

FIG. 3 is a perspective view of an embodiment of a computing device 300 in an open configuration. The computing device 300 is shown as a gaming console. The computing device 300 is shown without a display or input device. The computing device may connect directly and/or wirelessly to a display and/or input device. The computing device 300 may include one or more of the following computing components: a processor 304, memory 306, power source 308, input/output connections, communication devices, other computing components, or combinations thereof.

Figure 4:
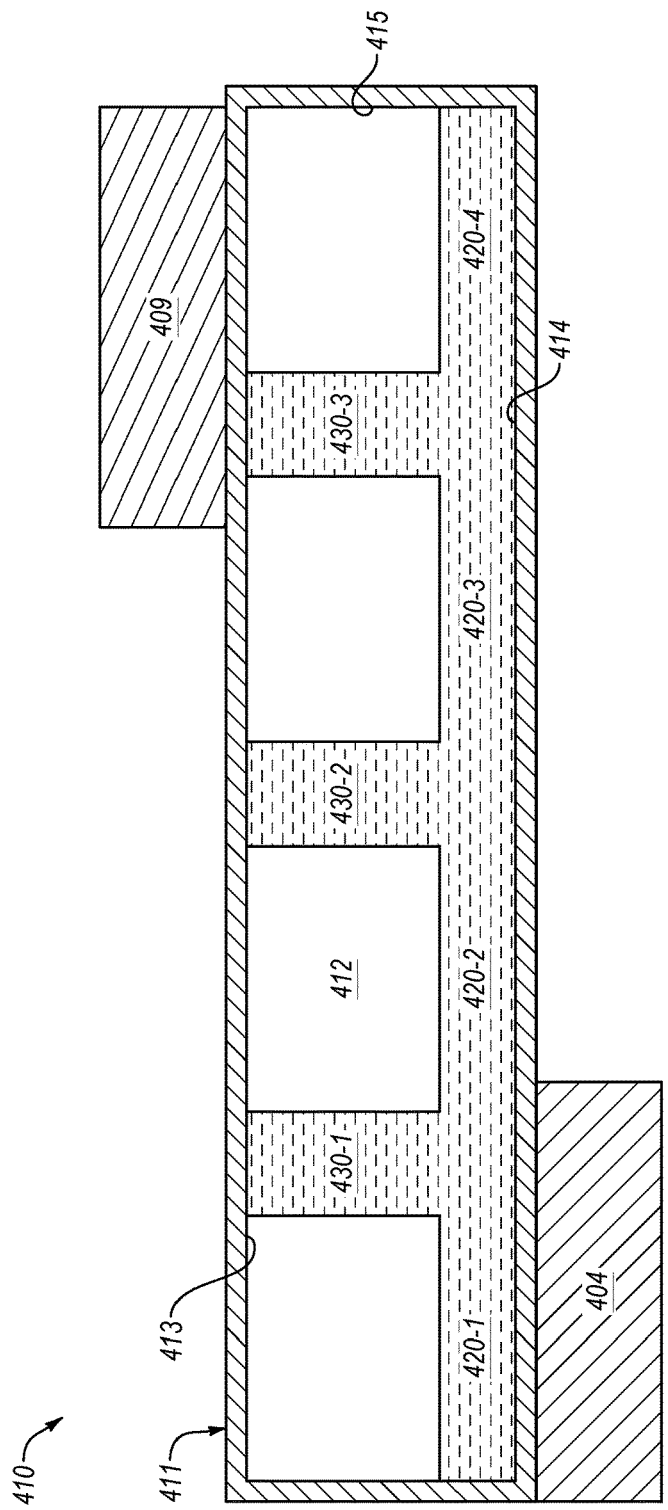
FIG. 4 is an embodiment of a thermal management device.

One or more computing components (e.g., components of the computing devices 100, 200, 300 in FIGS. 1-3) may generate heat. FIG. 4 is a cross-sectional view of an embodiment of a thermal management device 410 and illustrates that the thermal management device 410 may be used to manage heat from one or more computing components. The thermal management device 410 may include a housing 411. The housing 411 may be hermetically sealed. The thermal management device 410 may include a vapor chamber, a heat pipe, or other thermal management devices. A working fluid 412 may be housed within the housing 411.

When a computing component provides heat to the thermal management device 410, the working fluid 412 may undergo an evaporation/condensation cycle while circulating inside the housing 411, which may transfer applied heat in the process. As shown, the thermal management device 410 may include a heat sink 409. The heat sink 409 may distribute heat which may facilitate transformation of the working fluid 412. For example, the heat sink 409 may facilitate condensation of the working fluid 412. Although shown with one heat sink 409, in other embodiments more and/or larger heat sinks 409 may be used.

As shown, the thermal management device 410 may be in thermal communication with one or more computing components. For example, the thermal management device 410 may receive heat from one or more of the computing devices. In some embodiments, the thermal management device 410 may be in direct contact with one or more computing components. In some embodiments, the thermal management device 410 may be in indirect contact with one or more computing components. As shown, the housing 411 of the thermal management device 410 may abut a computing component. The computing component is shown as a processor 404. The computing component may transfer heat into the thermal management device 410.

The thermal management device 410 may include one or more wicking structures 420. The wicking structures 420 may facilitate transportation of the working fluid 412 from one part of the housing 411 to another. For example, as the computing component (e.g., processor 404) heats the working fluid 412, the working fluid 412 may evaporate and move toward an upper surface 413 of the housing (i.e., fill the available space in the housing 411). The working fluid 412 may move toward an outer surface 415 of the housing 411. For example, the heat sink 409 may create a temperature differential that induces a phase transformation of the working fluid effectively drawing the evaporated working fluid 412 toward the heat sink 409. As the evaporated working fluid 412 moves toward the outer surface 415 of the housing 411, a temperature differential may condense the working fluid 412 so that it moves toward a bottom surface 414. The wicking structures 420 may receive the condensed working fluid 412. The design of the wicking structures 420 may facilitate transportation of the working fluid 412 toward the computing component. For example, the wicking structures 420 may facilitate capillary action of the working fluid 412.

At least one embodiment of a thermal management device disclosed herein facilitates capillary wicking. At least one embodiment described herein facilitates uniform heat rejection. In other words, rejecting heat from a heat source at a location beyond the heat source. At least one embodiment described herein facilitates eliminating a hot spot of a heat source (e.g., a computing device) to make an isothermal device that uniformly rejects heat.

The thermal management device 410 may include one or more support structures 430. The support structures 430 may support the upper surface 413 of the housing 411. In at least one embodiment, the housing 411 may be at the liquid-vapor equilibrium pressure for the working fluid 412. As computing devices get thinner, housings 411 get thinner. In at least one embodiment, pressure within the housing 411 may be a vacuum compared to atmospheric pressure. Thinner housings 411 may be less capable of resisting pressure differentials between the housing 411 and the atmosphere thus allowing the upper surface 413 and the lower surface 414 to come closer together. If the upper surface 413 and the lower surface 414 come too close together, the evaporative/capillary action may be restricted. Thus, the one or more support structures 430 may resist these pressure differentials such that the upper surface 413 and the lower surface 414 remain properly separated.

Typical vapor chambers and heat pipes that include support structures are formed of a single, solid piece of material (e.g., a solid column of material). Single, solid support structures may take up valuable vapor real estate within the housing In some embodiments, the support structures 430 may be formed of a plurality of struts that may form a plurality of apertures, as will be described in detail below.

Typically, vapor chambers and heat pipe designs include wicks and supports that are commonly manufactured separately and then combined (e.g., fastened, adhered, bonded) later in an assembly step. However, tolerances and other manufacturing process limitations are often introduced in this process, which may lead to drops in thermal and/or support performance of the finished product compared to a theoretical part, may add unnecessary weight on to the system, and/or may take up too much space within the housing 411. At least one embodiment of a thermal management device disclosed herein facilitates both capillary wicking and support structure in the thermal management device.

As shown in FIG. 4, the wicking structures 420 and the support structures 430 may be formed in a single, unitary structure. For example, the wicking structures 420 and support structures 430 may be manufactured with additive manufacturing techniques to incorporate both the wick (capillary) and support (structural) functions in one single, unitary structure. In other words, both the wicking structure and the support structure may be formed as an integrally formed (e.g., formed from the same material by the same process) part.

In the embodiment of FIG. 4, the thermal management device 410 is shown with four wicking structures 420 and three support structures 430. The first wicking structure 420-1 may be connected to the first support structure 430-1. The first support structure 430-1 may be connected to a second wicking structure 420-2. The second wicking structure 420-2 may be connected to the second support structure 430-2. The second support structure 430-2 may be connected to a third wicking structure 420-3. The third wicking structure 420-3 may be connected to a third support structure 430-3. The third support structure 430-3 may be connected to the fourth wicking structure 420-4. In some embodiments, the wicking structures 420 and support structures 430 may be integrally formed. In some embodiments, more and/or fewer wicking structures 420 and/or support structures 430.

One or more wicking structures (e.g., wicking structures 420) and/or one or more support structures (e.g., support structures 430) may be made of various unit cell lattice structures that may (i) increase capillary transport of the working fluid, (ii) increase available vapor space within the housing 411, (iii) reduce weight of the thermal management device, or combinations thereof. The columnar supporting structures can be made with another lattice structure for compression loading.

Figures 1, 5:
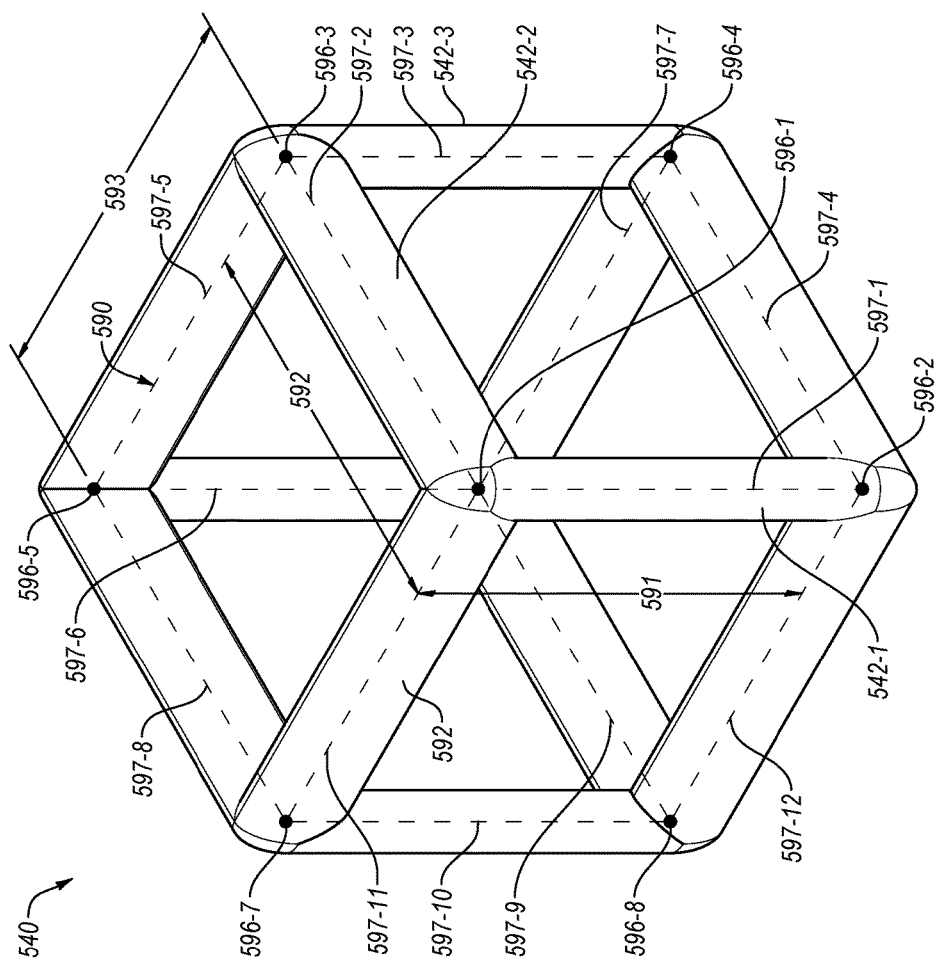
Figure 5:
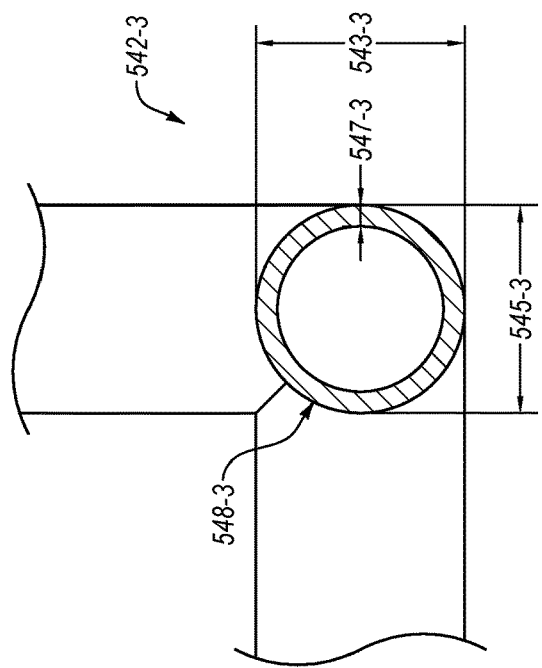
Figures 4, 5:
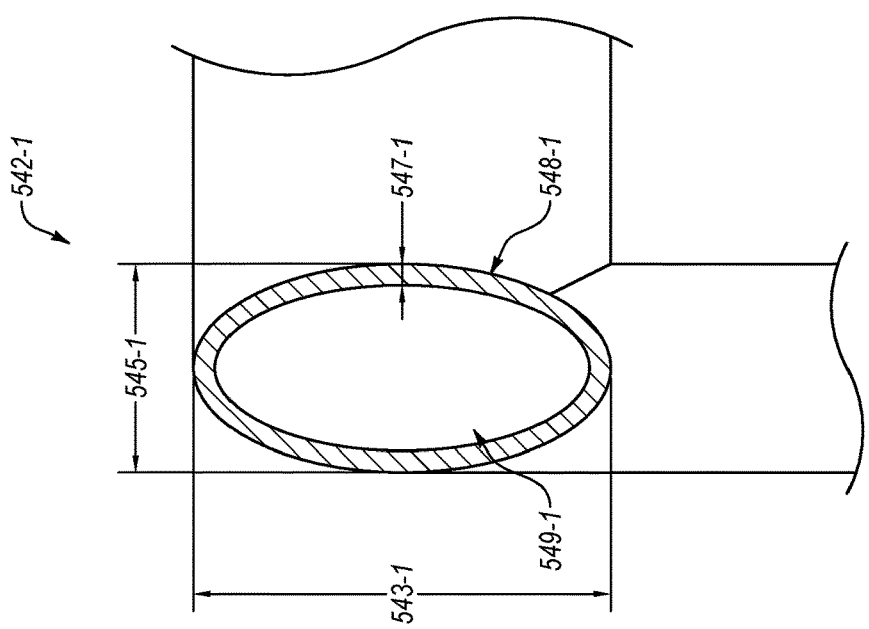

FIGS. 5-1 through 5-5 illustrate various views of a first embodiment of a unit cell 540. The unit cell 540 may be used as a wicking structure (e.g., wicking structure 420) and/or as a support structure (e.g., support structure 430). The unit cell 540 defines a volume 590. The volume 590 may have a major dimension. The major dimension may be a height 591, a width 592, or a depth 593. One or more of the height 591, width 592, and depth 593 may be greater than 20 microns, greater than 50 microns, between 20 microns and 200 microns, between 50 microns and 150 microns, less than 200 microns, or any value or range therebetween.

The volume 590 may include one or more vertices 596. Vertices 596 of one unit cell volume 590 may intersect with vertices 596 of another unit cell volume 590, as shown, for example, in FIGS. 6-1 through 6-3. The unit cell volume 590 may include eight vertices 596-1, 596-2, 596-3, 596-4, 596-5, 596-6, 596-7, 596-8. Interfaces 597 (e.g., edges) may be formed between the vertices 596. The first interface 597-1 may extend between the first vertex 596-1 and the second vertex 596-2, the second interface 597-2 may extend between the first vertex 596-1 and the third vertex 596-3, etc. Interfaces 597 of one unit cell 540 may intersect with interfaces 597 of one or more other unit cells 540. In some embodiments, interfaces 597 of one unit cell 540 may be collinear with interfaces 597 of one or more other unit cells 540.

The unit cell 540 may be formed with respect to a plurality of struts 542. For example, the struts 542 may cooperate to form the unit cell 540. In other words, the unit cell 540 may be formed relative to the struts 542. As shown in FIGS. 5-1 through 5-3, the third vertex 596-3 is formed at an intersection between a second strut 542-2, a third strut 542-3, and a fifth strut 542-5. As shown in FIGS. 5-1 through 5-5, one or more interfaces 597 may extend through one or more struts 542. For example, the first interface 597-1 may extend through the first strut 542-1.

The struts 542 may cooperate to form a first shape and the unit cell 540 may have a second shape. In some embodiments, the first shape and the second shape may be the same. For example, the struts 542, in FIGS. 5-1 through 5-5, may cooperate to form a cube and the unit cell 540 may also be shaped as a cube. In other embodiments, the struts 542 may cooperate to form a shape that is different from the shape of the unit cell 540.

The struts 542 may have a major dimension 543 and a minor dimension 545 in a cross-section perpendicular to a longitudinal axis of the strut 542. For example, as shown in FIG. 5-4, the first strut 542-1 has a major dimension 543-1 and a minor dimension 545-1, and, as shown in FIG. 5-5, the third strut 542-3 has a major dimension 543-3 and a minor dimension 545-3. As shown, the cross-section of the first and third strut 542-1, 542-3 may be elliptical. In other embodiments, the cross-section of one or more struts 542 may be elliptical, circular (e.g., the major dimension 543 and the minor dimension 545 being equal), polygonal, otherwise shaped, or combinations thereof. The major dimension 543 may be greater than five microns, between five microns and thirty microns, less than thirty microns, or any value or range therebetween. The minor dimension 545 may be greater than two microns, between two microns and ten microns, less than ten microns, or any value or range therebetween.

The cross-section may have an area. The cross-sectional area may be one or more of 0.25 mm$^2$, 1.0 mm$^2$, or any value or range therebetween.

The major dimension 543 and the minor dimension 545 may form a ratio. In some embodiments, the ratio of major dimension 543 and minor dimension 545 of all the struts 542 may be the same. In other embodiments, the ratio of major dimension 543 and minor dimension 545 of some of the struts 542 may be the same. In further embodiments, the ratio of major dimension 543 and minor dimension 545 of all the struts 542 may be different. For example, the ratio of the major dimension 543-1 and the minor dimension 545-1 of the first strut 542-1 may form a ratio of four to one. In another example, the ratio of the major dimension 543-3 and the minor dimension 545-3 of the third strut 542-3 may form a ratio of three to one. The ratios of major dimension 543 and minor dimension 545 may be 1:1, 1.5:1, 1.75:1, 2:1, 3:1, 4:1, 5:1, 10:1, or any value therebetween.

In at least one embodiment, one or more struts 542 may include a coating 548 and/or a base material 549. For example, as shown in FIG. 5-4, the first strut 542-1 may include a coating 548-1 over a base material 549-1. The coating 548-1 may include a thickness 547-1. As shown, the thickness 547 of each strut 542 may be uniform. In other embodiments, the thickness 547 of one or more struts 542 may vary. In another example, as shown in FIG. 5-5, the third strut 542-3 may include only a coating 548-3. In other words, the third strut 542-3 may be hollow such that the coating 548-3 forms a shell. Thicknesses 547 of the coatings 548 may be in a range of any of 2 angstroms, 3 angstroms, 5 angstroms, 10 angstroms, or any value therebetween.

The base material 549 may be produced with additive manufacturing (AM) techniques such as multi-photon lithography, stereo lithography (SLA), Digital Light Processing (DLP), or other AM techniques. In some embodiments, it may be desirable to convert the base material 549 (e.g., a polymer, a metal, ceramics) or another material formed by AM techniques to a metallic and/or ceramic structure before assembly into a thermal management device (e.g., thermal management device 410).

For example, Chemical Vapor Deposition (CVD), Atomic Layer Deposition (ALD), Physical Vapor Deposition (PVD), or other metallizing methods may be used to apply the coating 548 over the base material 549. During physical vapor deposition, a metal such as copper is vaporized under vacuum and coated onto the structure. In another example, in embodiments where the base material 549 is formed using a positive photo resist in the two-photon lithography method, a "negative" of the strut 542 may be manufactured creating a mold cavity that can be filled with metal using established electroplating techniques. Example metals that may be used may include copper, gold, nickel, other metals, or alloys thereof.

In another example, one or more struts 542 may be converted to a ceramic structure by deposition of precursor materials by ALD and subsequent conversion to ceramic using established methods. One or more struts 542 may also be fabricated using ceramic precursor materials or ceramic particle loading in the photoresists and resins used for each of these AM processes.

After coating the base material 549 with metal and/or ceramic, the base material 549 may be removed by exposing the struts 542 and subjecting them to oxygen plasma until the base material 549 is completely eroded leaving behind only the coating 548. In embodiments with a coating 548 and a base material 549, it may be desirable that the base material 549 remain sealed within the coating 548 to prevent contact between the base material 549 and the working fluid.

In embodiments with a hollow strut 542, the coating 548 may be sealed. In other embodiments, one or more struts 542 may include one or more apertures (not shown) in the coating 548. Struts 542 that are hollow and include one or more apertures may increase the amount of surface area of the strut 542. Larger surface area may increase the capillary action of the strut 542 and/or reduce the weight of the thermal management device 510.

A unit cell may have a portion of the unit cell that includes material and a portion of the unit cell that is open (e.g., without material). The percentage of the unit cell that includes material may be considered an effective volume fraction. For example, the unit cell 540 illustrated in FIGS. 5-1 through 5-5 may have an effective volume fraction of less than 10%, between 10% and 40%, less than 40%, or any value or range therebetween. The effective volume fraction may be based on a theoretical value. In other words, based on manufacturing tolerances and/or other considerations, the actual volume fraction may be larger than the theoretical effective volume value.

Figures 1, 6:
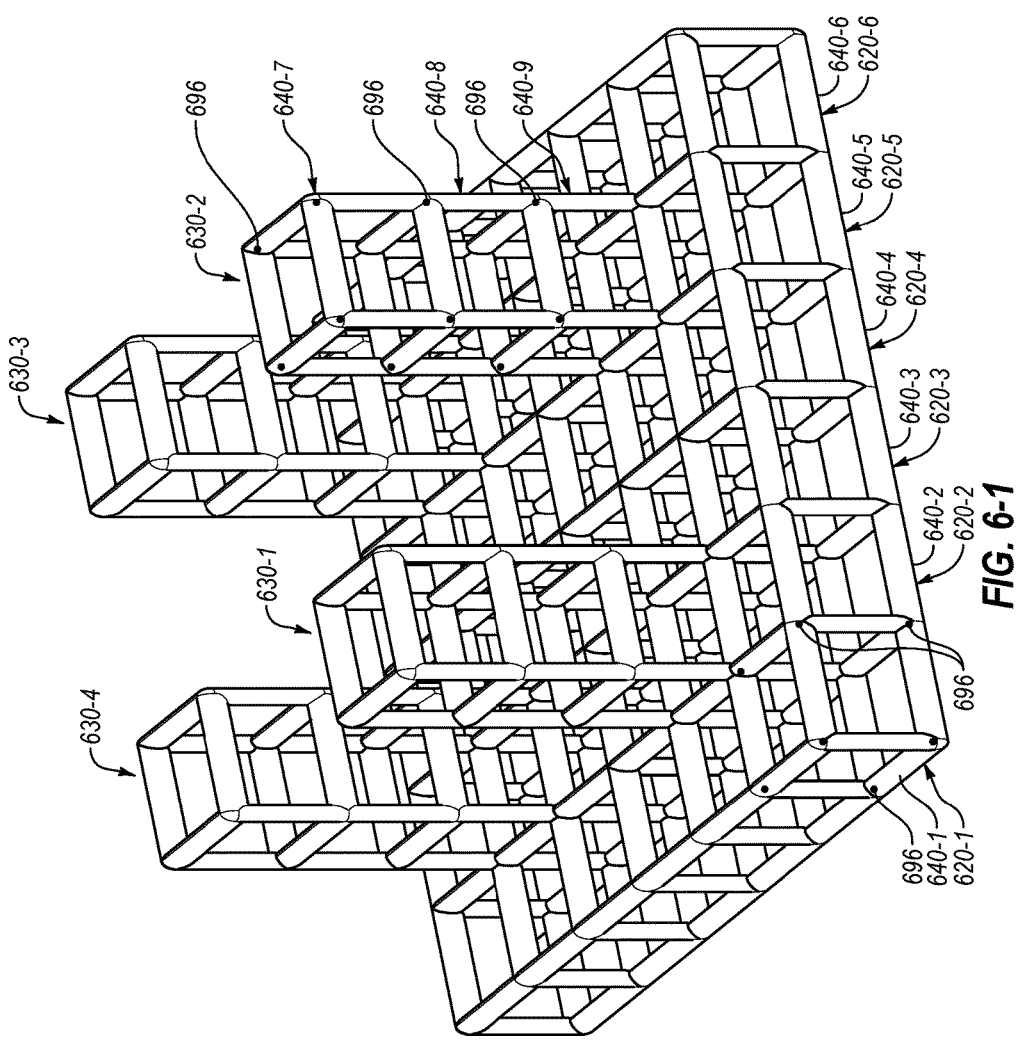
Figures 2, 6:
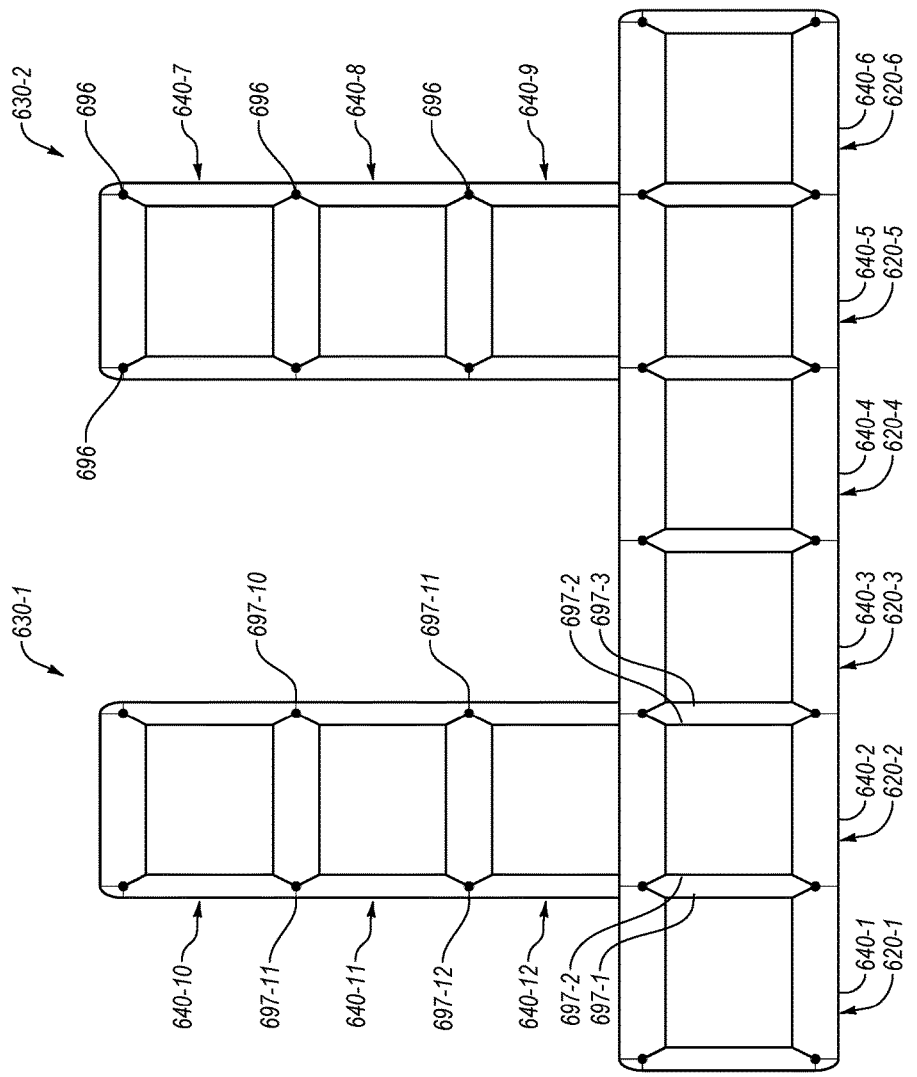
Figures 3, 6:
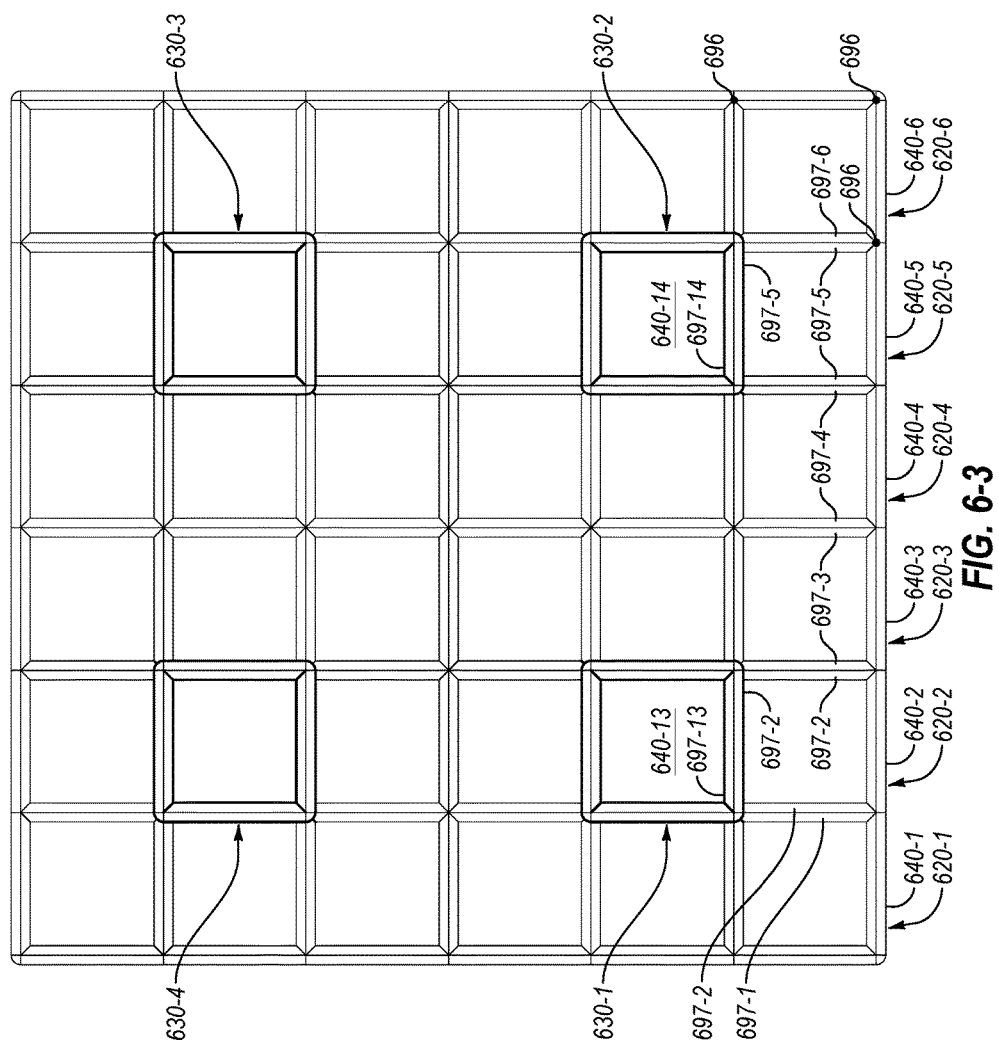

FIGS. 6-1 through 6-3 illustrate a first embodiment of a plurality of wicking structures 620 and a plurality of support structures 630. The plurality of wicking structures 620 may form a wick of a thermal management device. The plurality of support structures 630 may form the support structure for a thermal management device.

As shown, four support structures 630-1, 630-2, 630-3, 630-4 may be surrounded by thirty-two wicking structures 620-1 through 620-32. In other embodiments, more or fewer wicking structures 620 and/or support structures 630 may be used.

As shown, unit cells 640-1, 640-2, 640-3, 640-4, 640-5, 640-6 form a front side of the wick. Six unit cells are shown as forming the left, right, and back sides of the wick. In other embodiments, more or fewer unit cells 640 may form the sides of the wick.

As shown, the support structures 630 each include four unit cells 640. In other words, the support structures 630 may have a height of four unit cells 640. In other embodiments, more or fewer unit cells 640 may be used to form one or more support structures 630. As shown, unit cells 640-7, 640-8, 640-9 (shown in FIGS. 6-1 and 6-2), and 640-14 (shown in FIG. 6-3) form support structure 630-2 and unit cells 640-10, 640-11, 640-13 (shown in FIGS. 6-1 and 6-2), and 640-13 (Shown in FIG. 6-3) form support structure 630-1. Unit cells 640-13 and 640-14 may provide wicking and support functionality. Unit cells 640-7, 640-8, 640-9 of support structure 630-2 and unit cells 640-10, 640-11, 640-12 of support structure 630-1 are aligned with unit cells 613, 614. In other embodiments, one or more unit cells 640 of one or more support structures 630 may be not be aligned.

As shown, the support structures 630 are of equal height. In other words, each support structure 630 is shown with an equal number of unit cells 640. In other embodiments, one or more support structures 630 may differ in height from one or more other support structures.

Unit cells 640 may be connected to other unit cells 640. For example, unit cell 640-2 is connected to unit cell 640-1 and unit cell 640-3. Unit cells 640 may be connected at at least one vertex 696 and/or at at least one interface 697. As shown in FIG. 6-1, unit cell 640-1 is connected to unit cell 640-2 at at least one vertex 696 and unit cell 640-3 is connected to unit cell 640-2 at at least one vertex 696. As shown in FIG. 6-2, unit cell 640-1 is connected to unit cell 640-2 at right interface 697-1 of unit cell 640-1 and left interface 697-2 of unit cell 640-2 and unit cell 640-3 is connected to unit cell 640-2 at left interface 697-3 of unit cell 640-3 and right interface 697-2 of unit cell 640-2. In another example, as shown in FIG. 6-3, unit cell 640-2 is connected to unit cell 640-1, unit cell 640-3, and 640-13. Unit cell 640-2 is connected to unit cell 640-1 at right interface 697-1 of unit cell 640-1 and at left interface 697-2 of unit cell 640-2, connected to unit cell 640-3 at left interface 697-3 of unit cell 640-3 and at right interface 697-2 of unit cell 640-2, and connected to unit cell 640-13 at top interface 697-13 of unit cell 640-13 and at bottom interface 697-2 of unit cell 640-2.

Figures 1, 7:
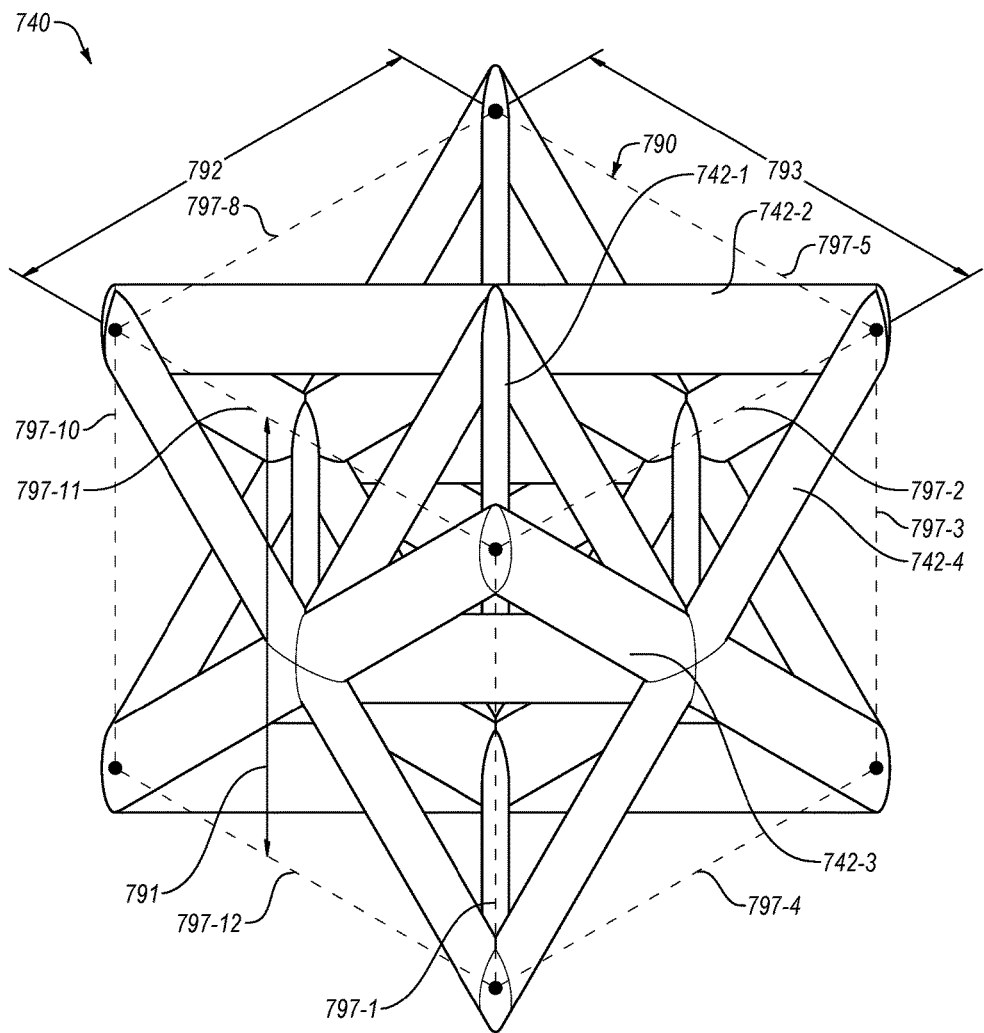
Figures 2, 7:
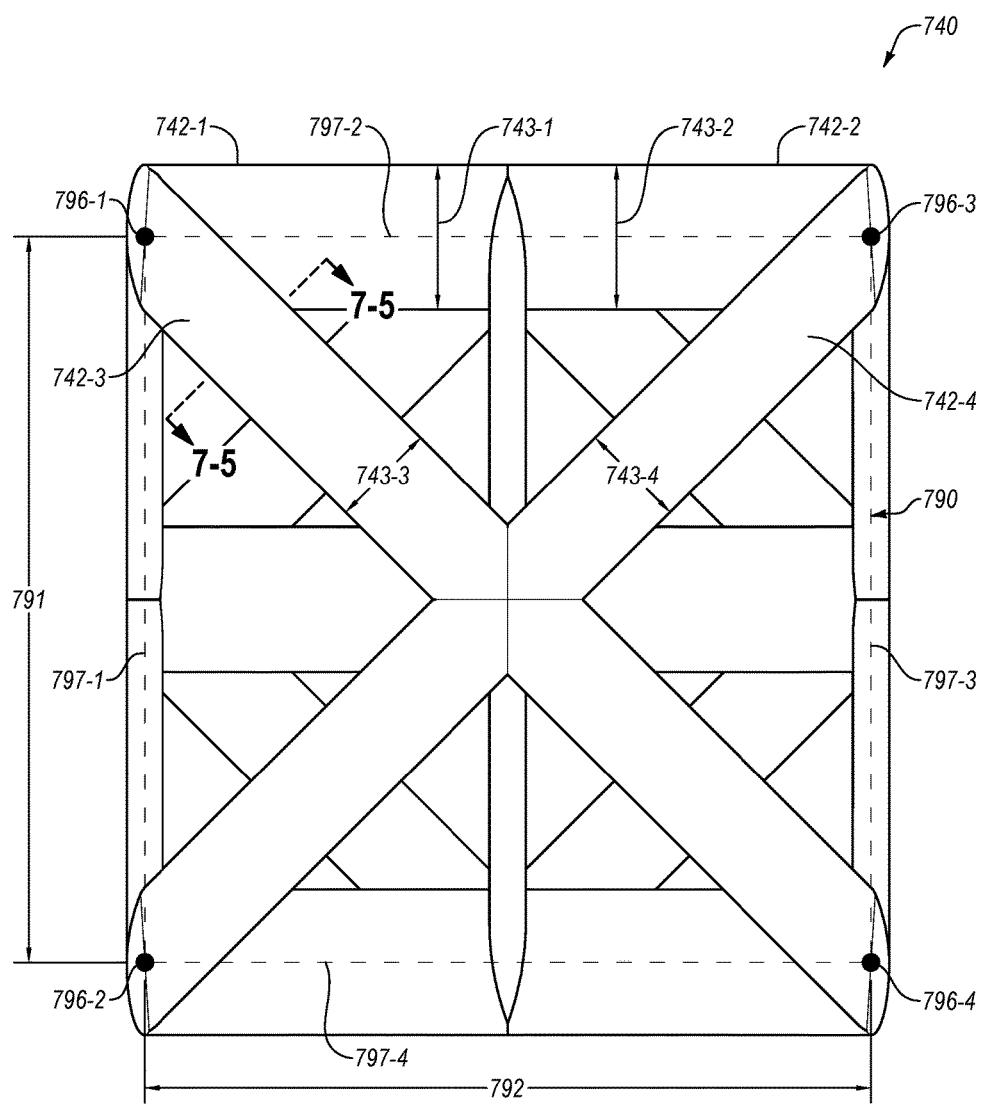
Figures 3, 7:
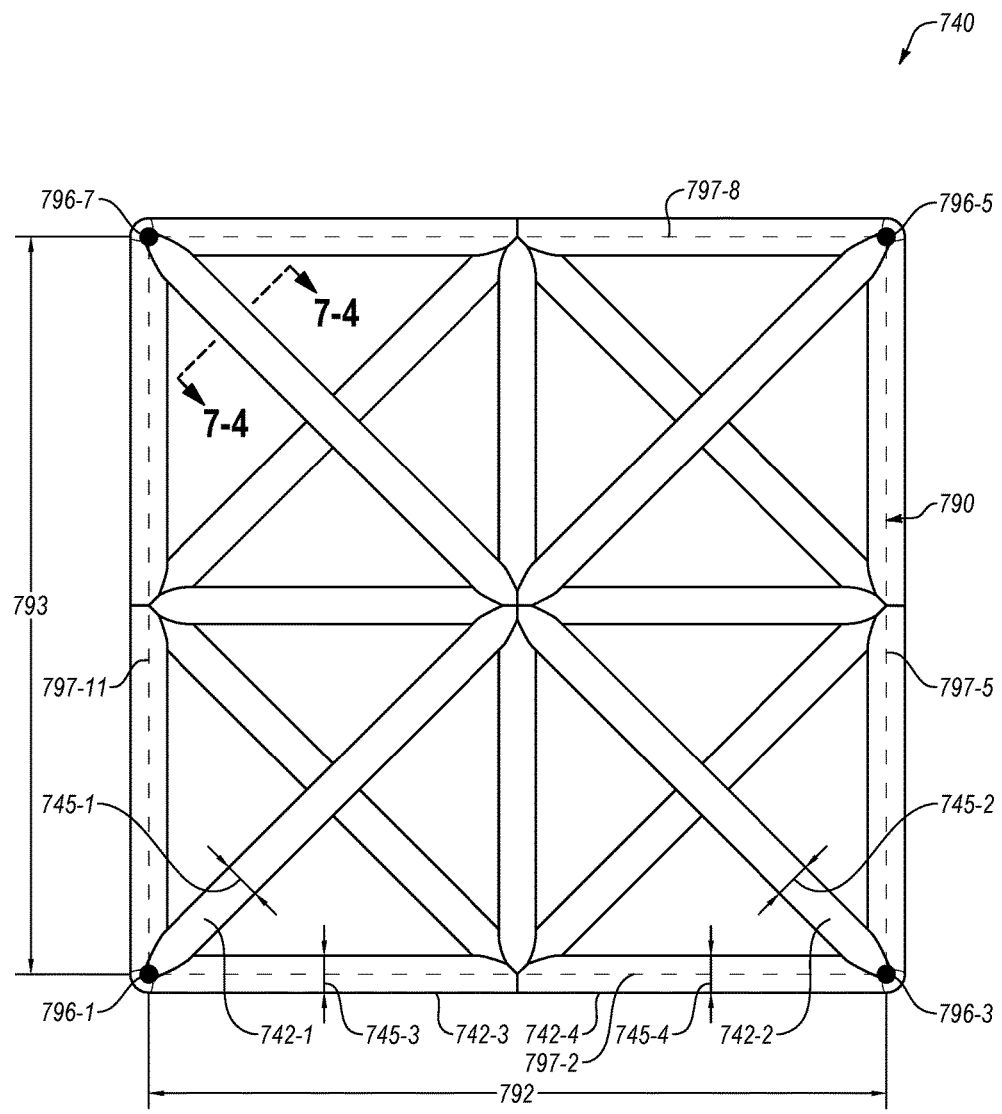
Figures 5, 7:
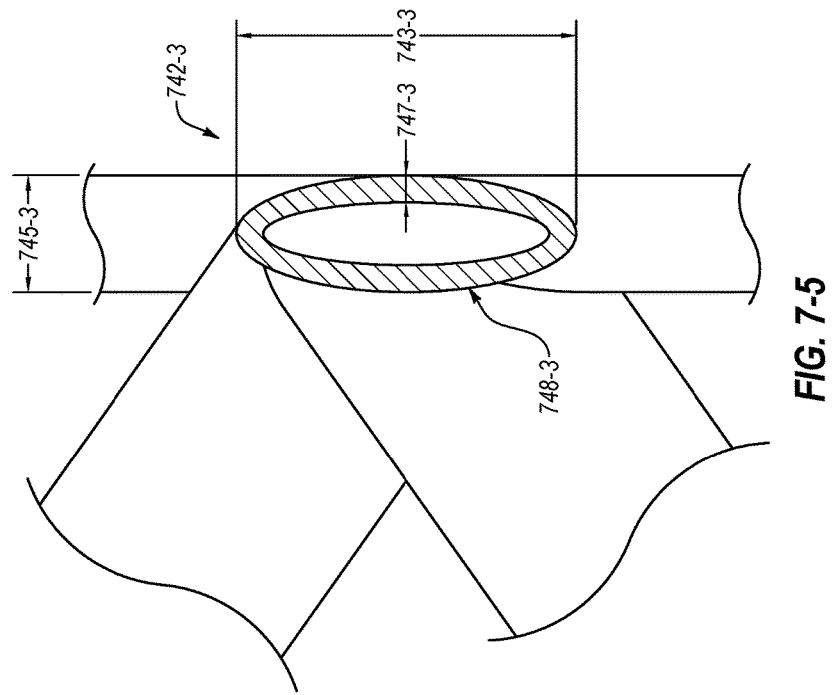
Figures 4, 7:
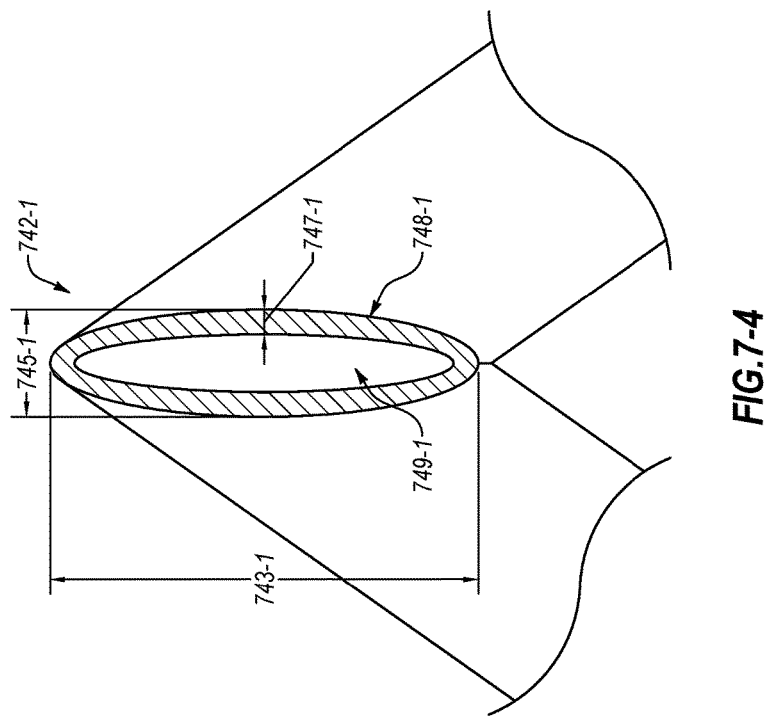
Figure 7:
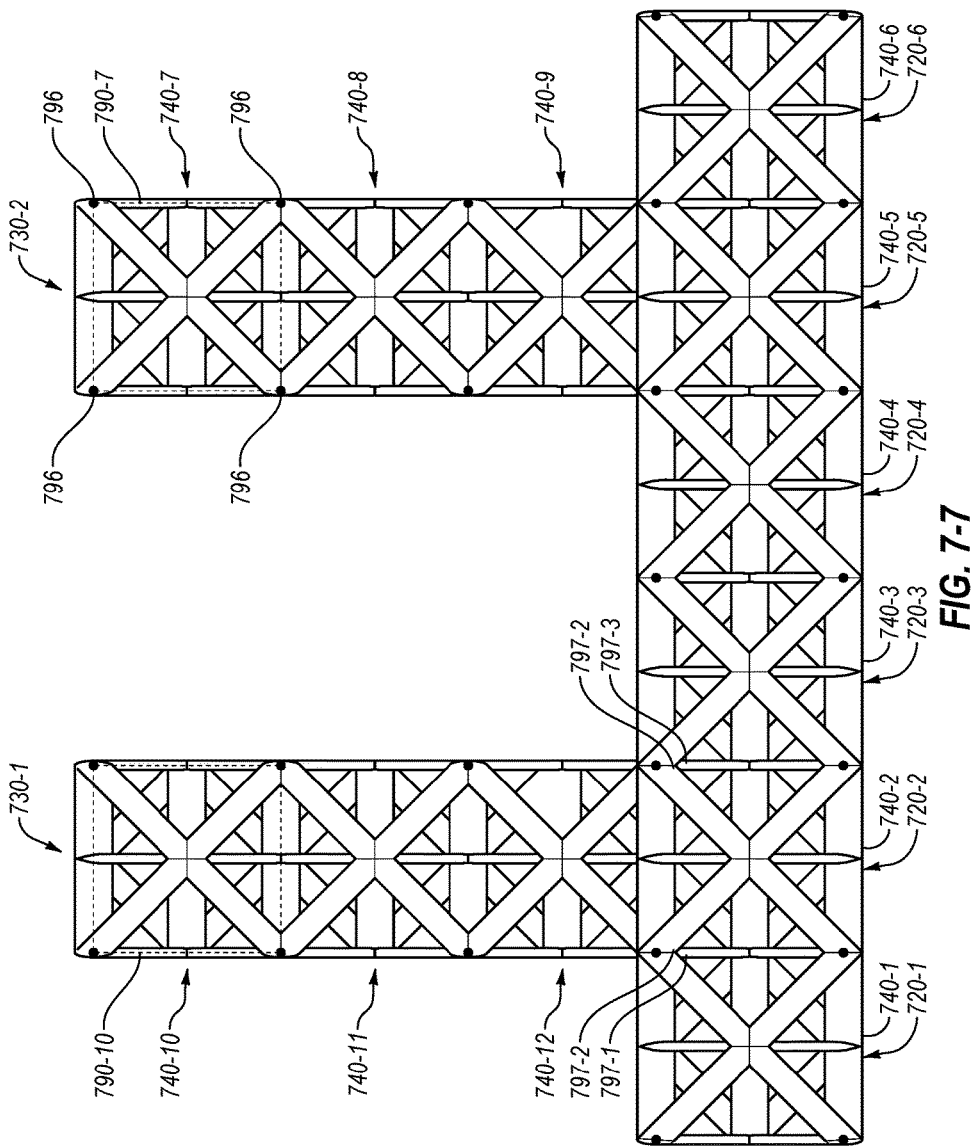

FIGS. 7-1 through 7-5 illustrate various views of a second embodiment of a unit cell 740. For ease of description, differences between the first embodiment of a unit cell of FIGS. 5-1 through 5-3 and the second embodiment of the unit cell 740 of FIGS. 7-1 through 7-5 will be highlighted. For ease of description, like numbers will be used for like features. Components (e.g., struts, vertices, interfaces, other components) of or features of one or more of the embodiments of unit cells of FIGS. 5-1 through 11-3 may be included in one or more other embodiments of the wicking structures and/or support structures of FIGS. 5-1 through 11-3. For example, one or more unit cells 540 of FIGS. 5-1 through 5-5 may be used with one or more unit cells 740 of FIG. 7-1 through 7-5 for a wicking structure 1020 and/or support structure 1030 of FIGS. 10-1 through 10-3. All combinations and permutations are contemplated and may be claimed.

The unit cell 740 may be used as a wicking structure (e.g., wicking structure 420) and/or as a support structure (e.g., support structure 430). The unit cell 740 defines a volume 790. The volume 790 may have a height 791, a width 792, and a depth 793. One or more of the height 791, width 792, and depth 793 may be greater than 50 microns, between 50 microns and 200 microns, between 100 microns and 1.0 millimeter, less than 1.0 millimeter, or any value or range therebetween.

The volume 790 may include one or more vertices 796. Vertices 796 of one unit cell volume 790 may intersect with vertices 796 of one or more other unit cell volumes 790, as shown, for example, in FIGS. 7-1 through 7-5. The unit cell volume 790 may include eight vertices 796-1, 796-2, 796-3, 796-4, 796-5, 796-6, 796-7, 796-8. Interfaces 797 (e.g., edges) may be formed between the vertices 796. The first interface 797-1 may extend between the first vertex 796-1 and the second vertex 796-2, the second interface 797-2 may extend between the first vertex 796-1 and the third vertex 796-3, etc. Interfaces 797 of one unit cell 740 may intersect with interfaces 797 of one or more other unit cells 740. In some embodiments, interfaces 797 of one unit cell 740 may be collinear with interfaces 797 of one or more other unit cells 740.

The unit cell 740 may be formed with respect to a plurality of struts 742. As shown in FIGS. 7-1 through 7-5, the vertices 796 may be formed at intersections between struts 742. As shown, one or more interfaces 797 may not extend through one or more struts 742. For example, unlike the first interface 597-1 of FIGS. 5-1 through 5-5 that is shown extending entirely through the first strut 542-1, the first interface 797-1 only extends partially through four struts 742.

The struts 742 may cooperate to form a first shape and the unit cell 740 may have a second shape. In some embodiments, the first shape and the second shape may be different. For example, the struts 742, in FIGS. 7-1 through 7-5, may cooperate to form an octet (e.g., an octahedron combined with a tetrahedron) and the unit cell 740 may be shaped as a cube. In other embodiments, the struts 742 may cooperate to form a shape that is the same shape as the shape of the unit cell 740.

The struts 742 may have a major dimension 743 and a minor dimension 745 in a cross-section perpendicular to a longitudinal axis of the strut 742. For example, as shown in FIG. 7-4, the first strut 742-1 has a major dimension 743-1 and a minor dimension 745-1, and, as shown in FIG. 7-5, the third strut 742-3 has a major dimension 743-3 and a minor dimension 745-3. The major dimension 743 may be greater than five microns, between five microns and thirty microns, less than thirty microns, or any value or range therebetween. The minor dimension 745 may be greater than two microns, between two microns and ten microns, less than ten microns, or any value or range therebetween. The major dimension 743 and the minor dimension 745 may form a ratio, as described above.

In at least one embodiment, one or more struts 742 may include a coating 748 and/or a base material 749. The coating 748 may include a thickness 747, as described above. The base material 749 and/or coating 748 may be produced as described above. In embodiments with a coating 748, the coating 748 may form a shell.

The unit cell 740 illustrated in FIGS. 7-1 through 7-5 may have an effective volume fraction of less than 20%, between 20% and 50%, less than 30%, less than 40%, less than 50%, or any value or range therebetween.

Figures 7, 8:
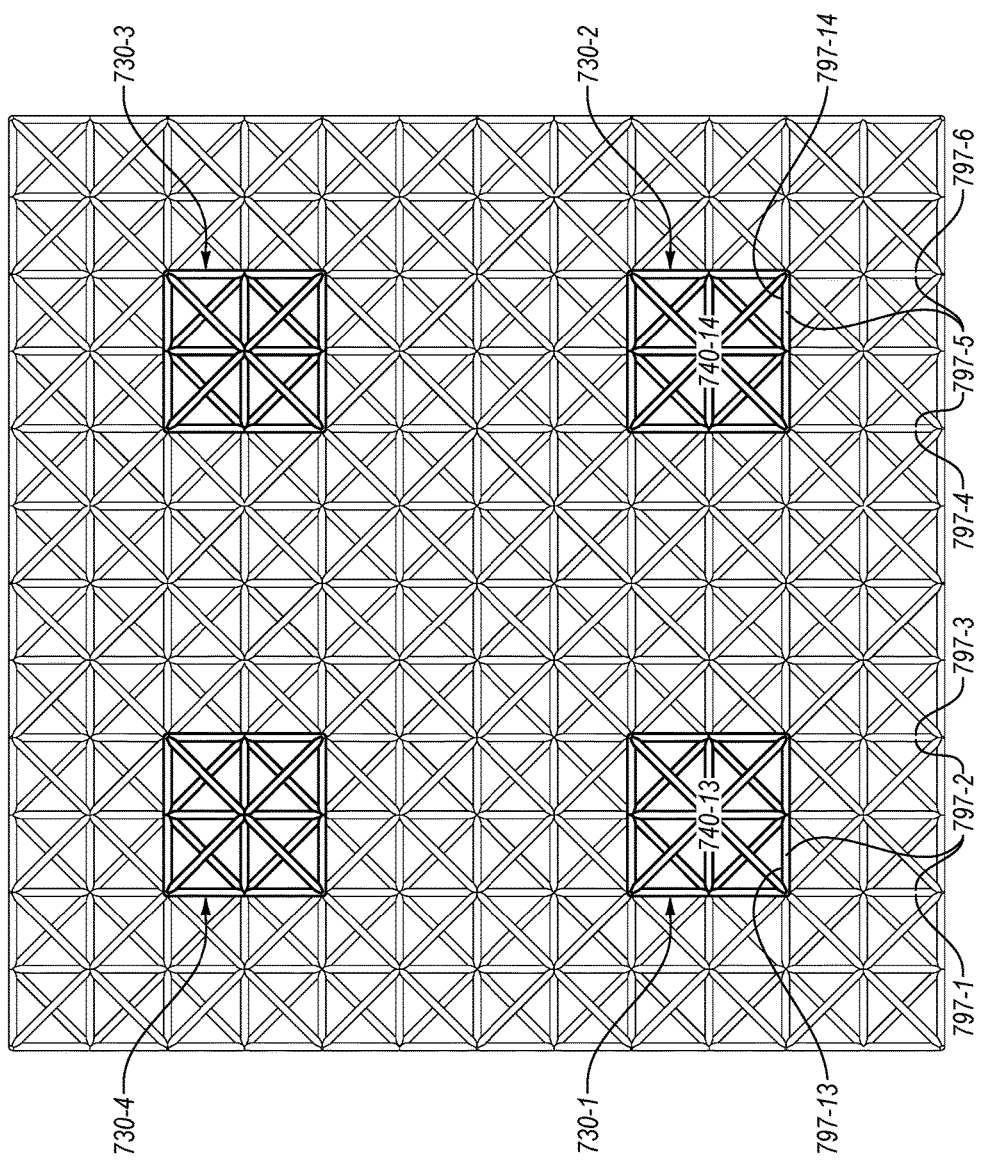
Figures 1, 8:
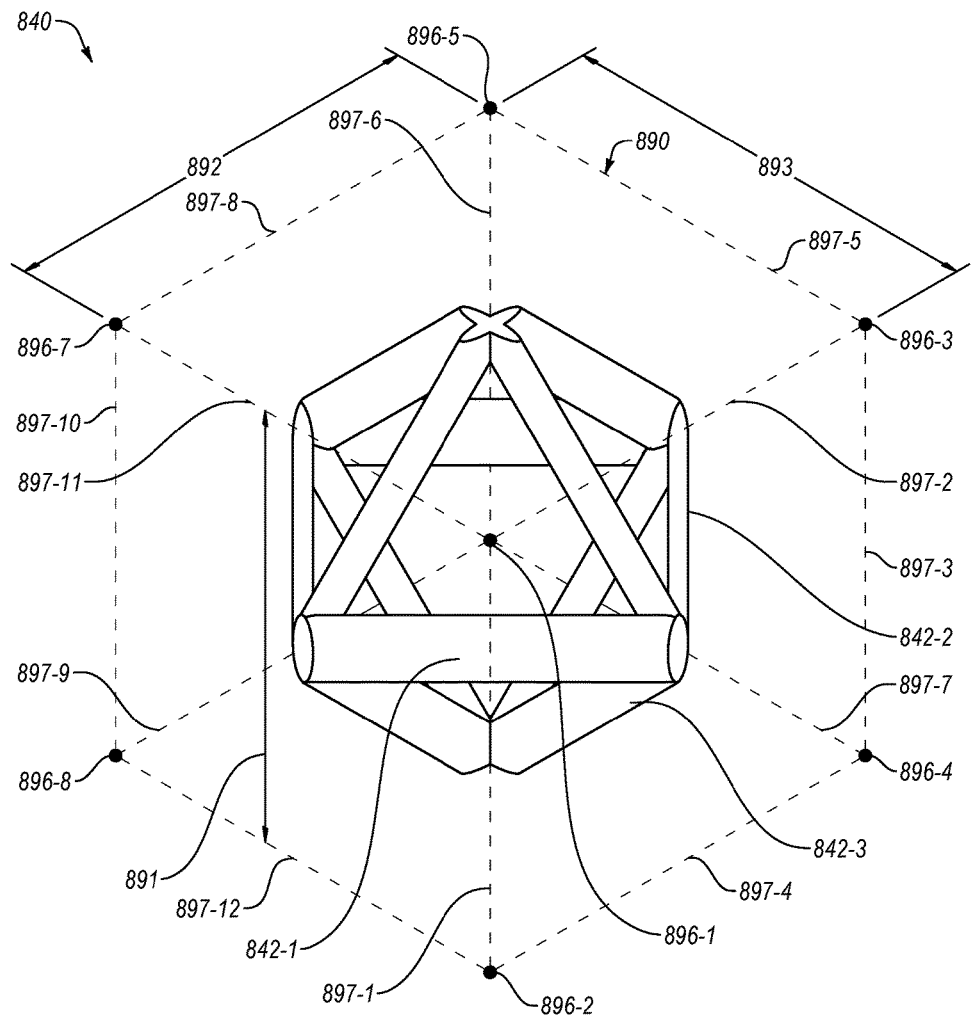
Figures 2, 8:
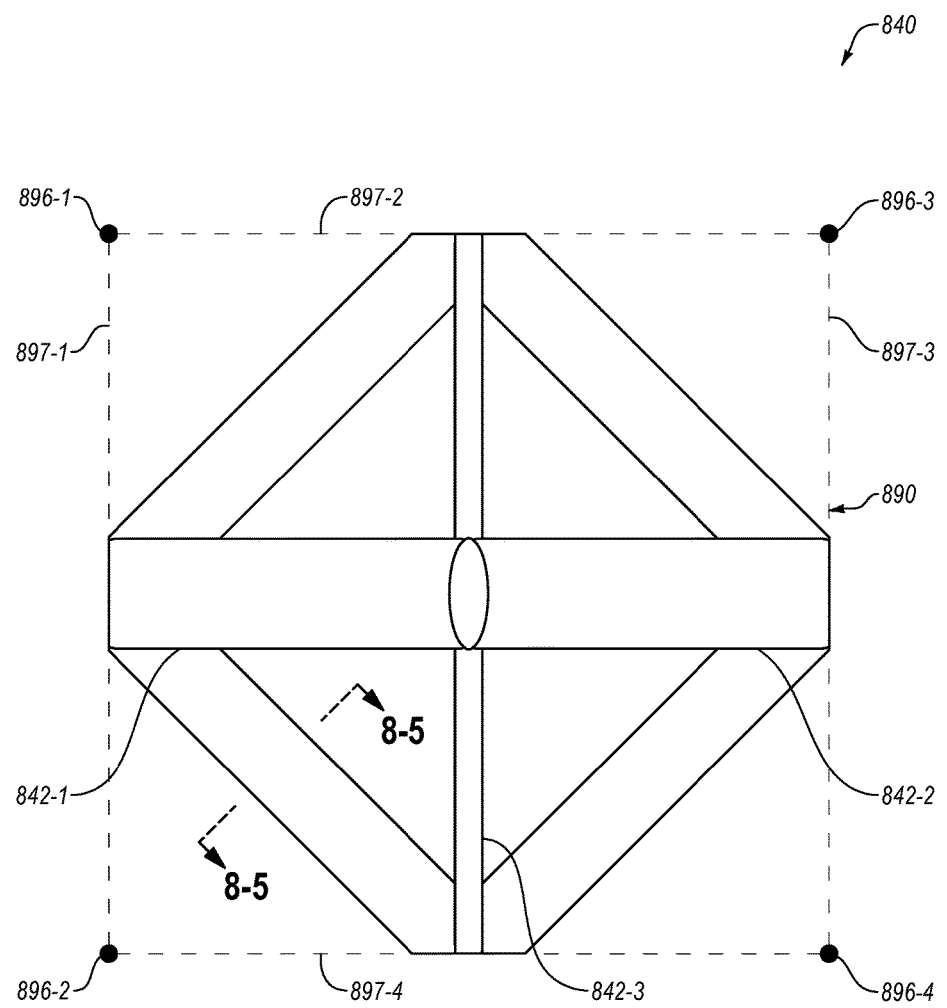
Figures 3, 8:
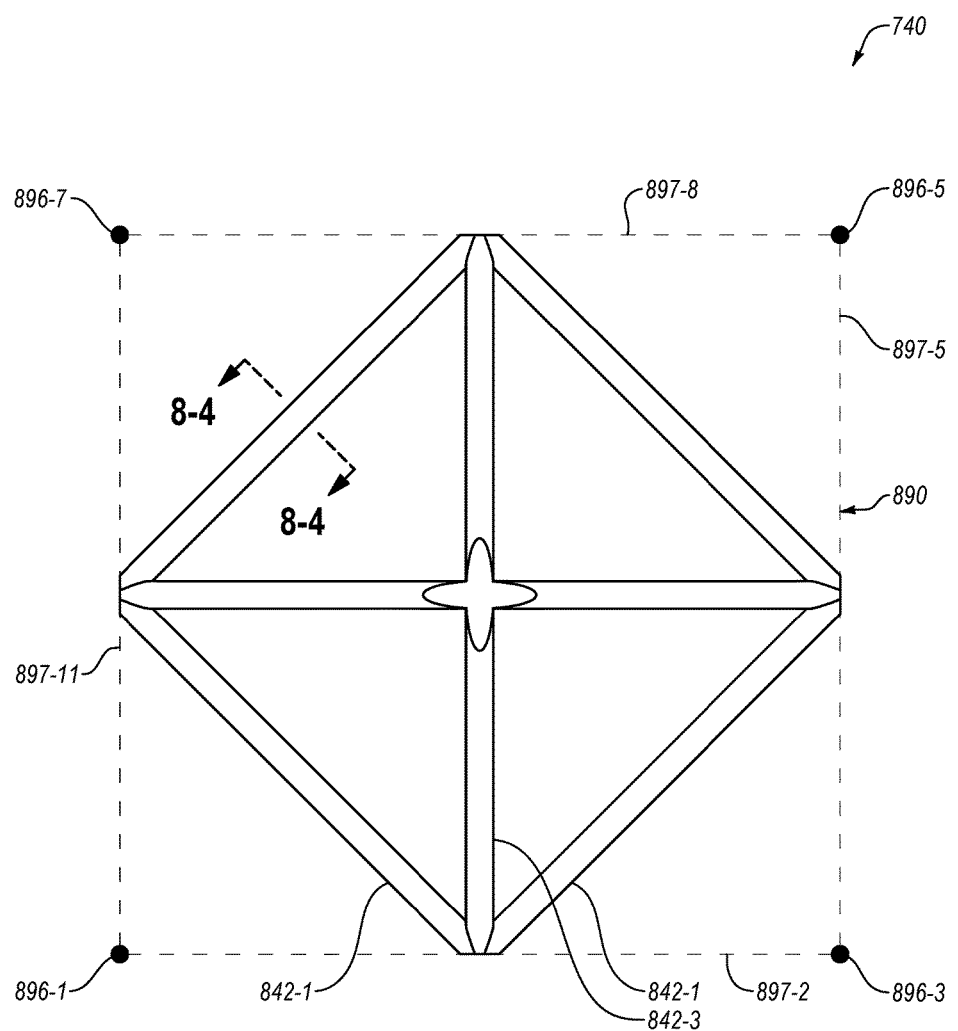
Figures 5, 8:
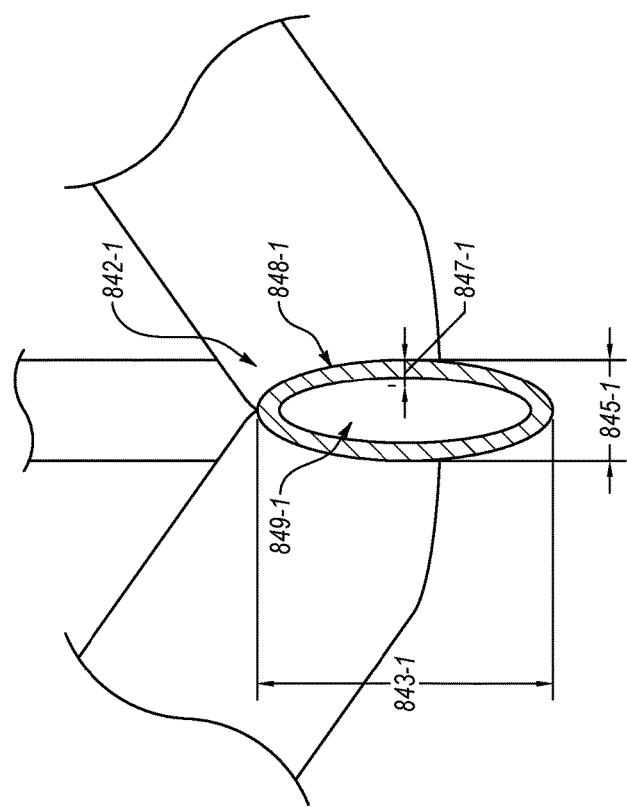
Figures 4, 8:
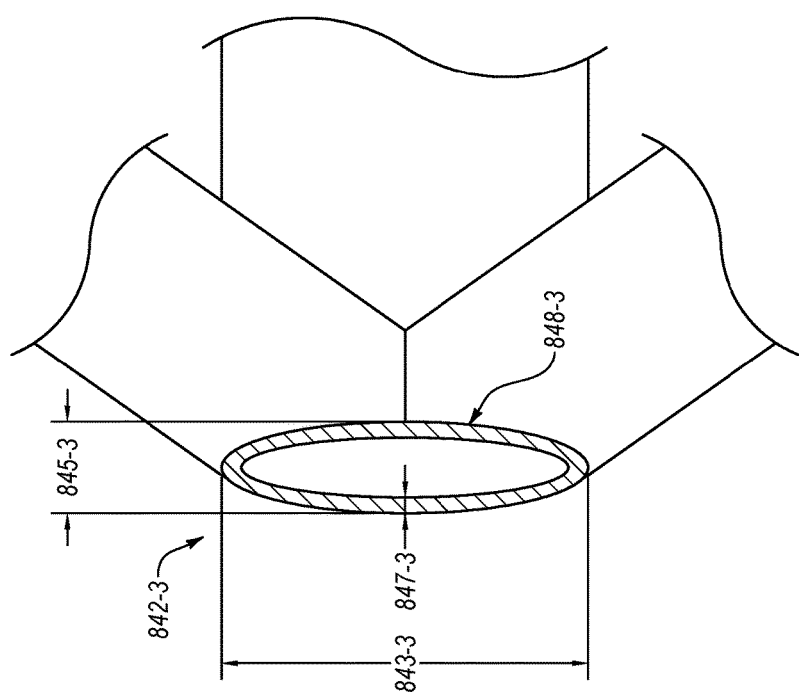

FIGS. 7-6 through 7-8 illustrate a second embodiment of a plurality of wicking structures 720 and a plurality of support structures 730. The plurality of wicking structures 720 may form a wick of a thermal management device. The plurality of support structures 730 may form the support structure for a thermal management device.

As shown, a plurality of support structures 730 may be surrounded by a plurality of wicking structures 720. Unit cells 740-13 and 740-14 may provide wicking and support functionality. Unit cells 740-7, 740-8, 740-9 of support structure 730-2 and unit cells 740-10, 740-11, 740-12 of support structure 730-1 are aligned with unit cells 713, 714. As shown, the support structures 730 are of equal height.

Unit cells 740 may be connected to other unit cells 740. Unit cells 740 may be connected at at least one vertex 796 and/or at at least one interface 797. As shown in FIG. 7-6, unit cell 740-1 is connected to unit cell 740-2 at at least one vertex 796 and unit cell 740-3 is connected to unit cell 740-2 at at least one vertex 796, as described above.

FIGS. 8-1 through 8-5 illustrate various views of a third embodiment of a unit cell 840. For ease of description, differences between the first embodiment of a unit cell of FIGS. 5-1 through 5-3, the second embodiment of the unit cell 740 of FIGS. 7-1 through 7-5, and the third embodiment of unit cell 840 of FIG. 8-1 through 8-5 will be highlighted. For ease of description, like numbers will be used for like features. Components (e.g., struts, vertices, interfaces, other components) of or features of one or more of the embodiments of unit cells of FIGS. 5-1 through 11-3 may be included in one or more other embodiments of the wicking structures and/or support structures of FIGS. 5-1 through 11-3. All combinations and permutations are contemplated and may be claimed.

The unit cell 840 may be used as a wicking structure (e.g., wicking structure 420) and/or as a support structure (e.g., support structure 430). The unit cell 840 defines a volume 890. The volume 890 may have a height 891, a width 892, and a depth 893. One or more of the height 891, width 892, and depth 893 may be greater than 50 microns, between 50 microns and 200 microns, between 100 microns and 1.0 millimeter, less than 1.0 millimeter, or any value or range therebetween.

The volume 890 may include one or more vertices 896. Vertices 896 of one unit cell volume 890 may intersect with vertices 896 of one or more other unit cell volumes 890, as shown, for example, in FIGS. 8-1 through 8-5. The unit cell volume 890 may include eight vertices 896-1, 896-2, 896-3, 896-4, 896-5, 896-6, 896-7, 896-8. Interfaces 897 (e.g., edges) may be formed between the vertices 896. The first interface 897-1 may extend between the first vertex 896-1 and the second vertex 896-2, the second interface 897-2 may extend between the first vertex 896-1 and the third vertex 896-3, etc. Interfaces 897 of one unit cell 840 may intersect with interfaces 897 of one or more other unit cells 840. In some embodiments, interfaces 897 of one unit cell 840 may be collinear with interfaces 897 of one or more other unit cells 840.

The unit cell 840 may be formed with respect to a plurality of struts 842. As shown in FIGS. 8-1 through 8-5 and unlike the vertices 596, 796 in FIGS. 5-1 through 7-5, the vertices 896 may not be formed at intersections between struts 842. As shown, one or more interfaces 897 may only partially extend through one or more struts 842. For example, unlike the first interface 597-1 of FIGS. 5-1 through 5-5 that is shown extending entirely through the first strut 542-1, the first interface 897-1 only extends partially through four struts 842. Unlike the first interface 797-1 of FIGS. 7-1 through 7-5, the first interface 897-1 only extends through an end of the first strut 842-1.

The struts 842 may cooperate to form a first shape and the unit cell 840 may have a second shape. In some embodiments, the first shape and the second shape may be different. For example, the struts 842, in FIGS. 8-1 through 8-5, may cooperate to form an octet (e.g., an octahedron combined with a tetrahedron) and the unit cell 840 may be shaped as a cube. In other embodiments, the struts 842 may cooperate to form a shape that is the same shape as the shape of the unit cell 840.

The struts 842 may have a major dimension 843 and a minor dimension 845 in a cross-section perpendicular to a longitudinal axis of the strut 842. For example, as shown in FIG. 8-4, the first strut 842-1 has a major dimension 843-1 and a minor dimension 845-1, and, as shown in FIG. 8-5, the third strut 842-3 has a major dimension 843-3 and a minor dimension 845-3. The major dimension 843 may be greater than five microns, between five microns and twenty microns, less than twenty microns, or any value or range therebetween. The minor dimension 845 may be greater than two microns, between two microns and ten microns, less than ten microns, or any value or range therebetween. The major dimension 843 and the minor dimension 845 may form a ratio, as described above.

In at least one embodiment, one or more struts 842 may include a coating 848 and/or a base material 849. The coating 848 may include a thickness 847, as described above. The base material 849 and/or coating 848 may be produced as described above.

The unit cell 840 illustrated in FIGS. 8-1 through 8-5 may have an effective volume fraction of less than 15%, between 15% and 40%, less than 30%, less than 40%, or any value or range therebetween.

Figures 1, 9:
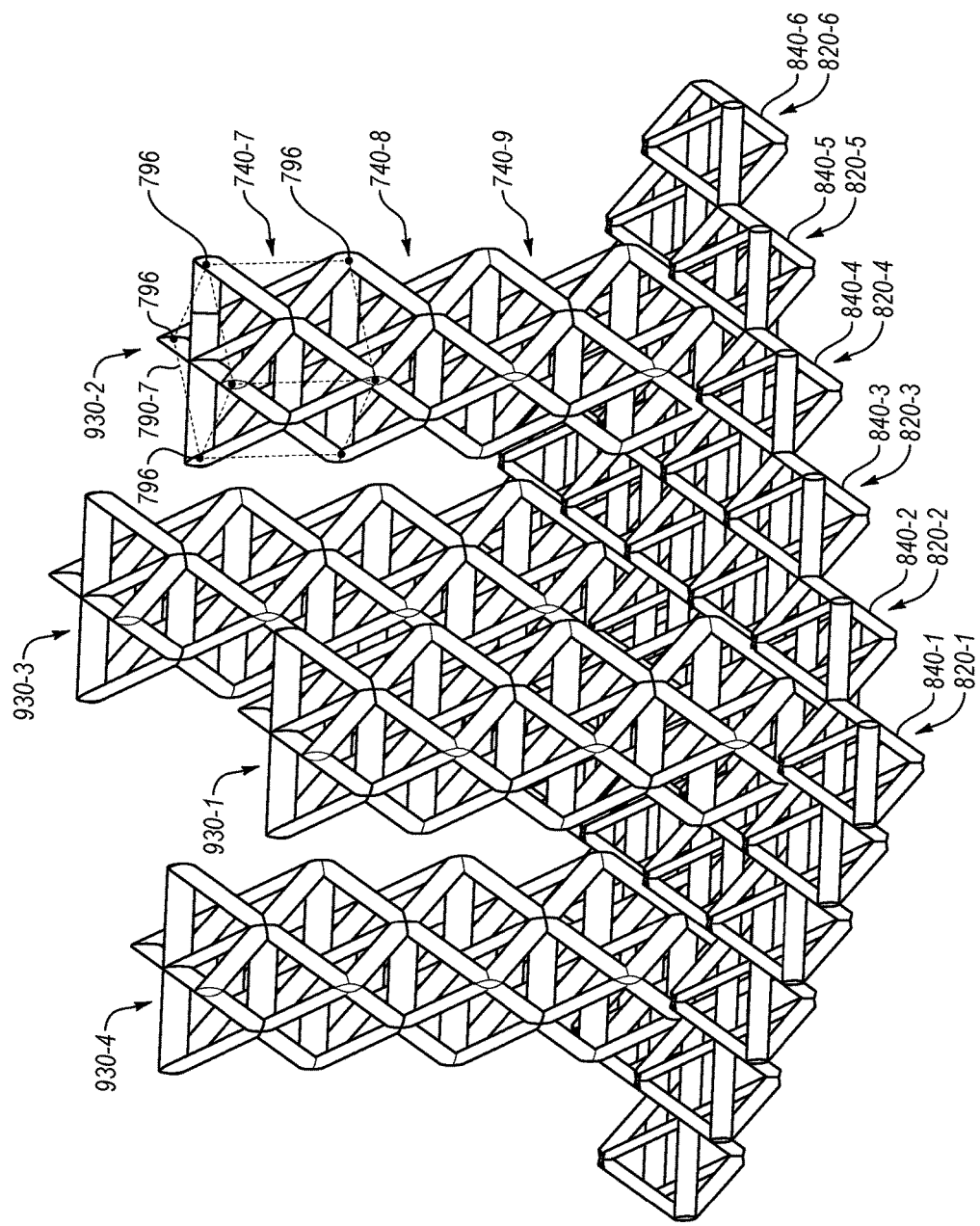
Figures 2, 9:
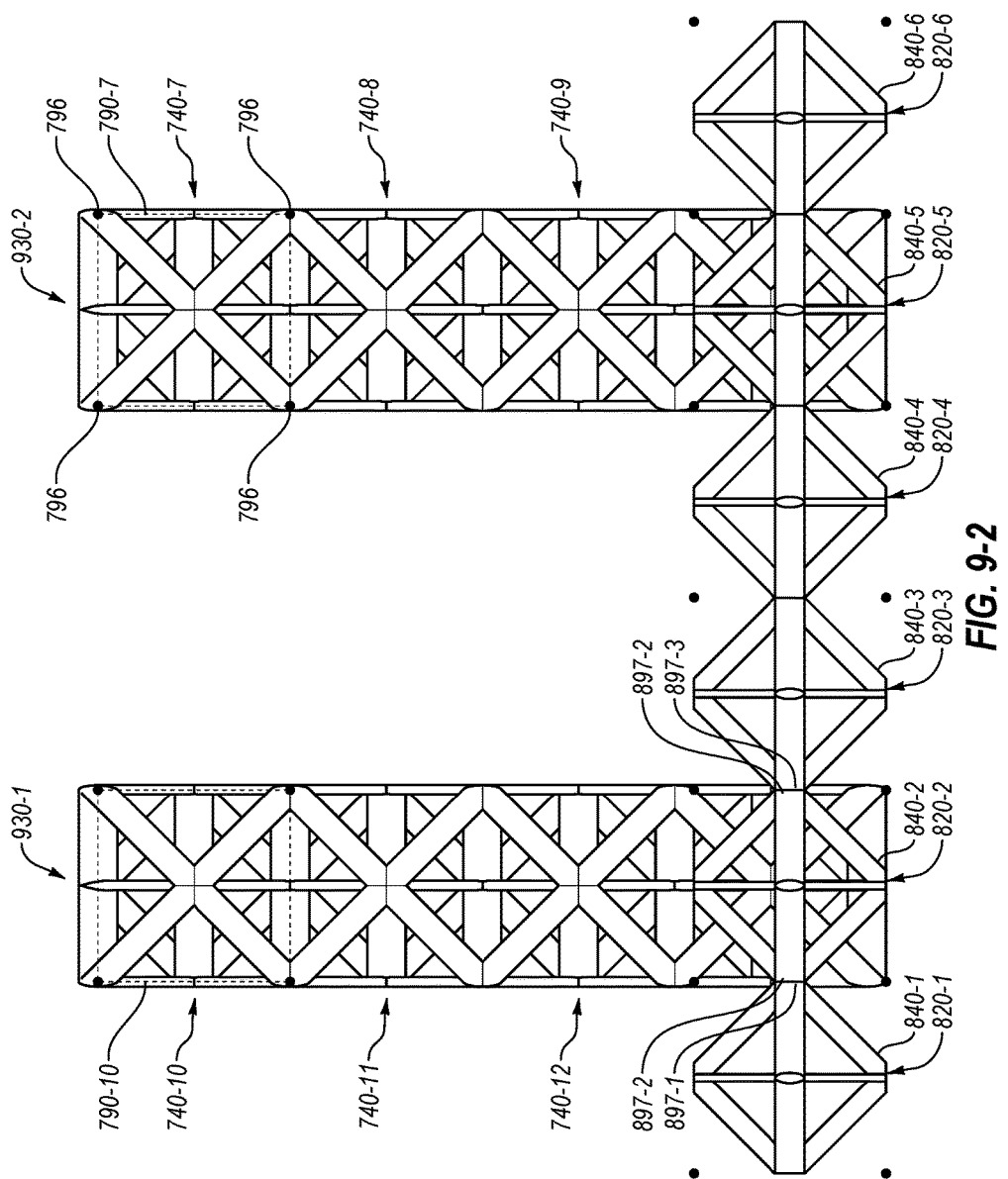
Figures 3, 9:
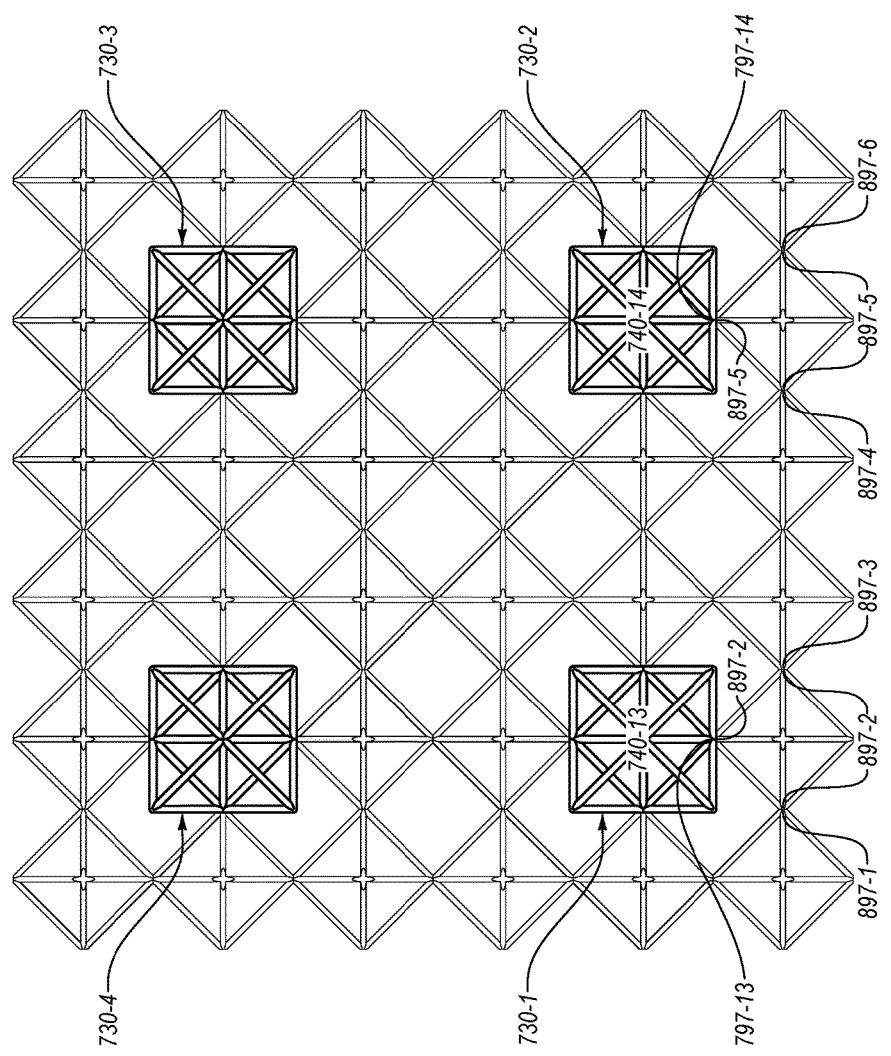

FIGS. 9-1 through 9-3 illustrate a fourth embodiment of a plurality of wicking structures 820 and a plurality of support structures 930. The plurality of wicking structures 820 may form a wick of a thermal management device. The plurality of support structures 930 may form the support structure for a thermal management device and.

As shown, a plurality of support structures 930 may be surrounded by a plurality of wicking structures 820. The plurality of support structures 930 may include unit cells 740 of FIGS. 7-1 through 7-5. As shown, the plurality of wicking structures 820 may include the unit cells 840 of FIGS. 8-1 through 8-5. Unit cells 740-13 and 740-14 may provide wicking and support functionality. Unit cells 740-7, 740-8, 740-9 of support structure 730-2 and unit cells 740-10, 740-11, 740-12 of support structure 930-1 are aligned with unit cells 713, 714. As shown, the support structures 930 are of equal height.

Unit cells 740, 840 may be connected to other unit cells 740, 840. Unit cells 740, 840 may be connected at at least one vertex 996 and/or at at least one interface 997. As shown in FIG. 9-1, unit cell 840-1 is connected to unit cell 840-2 at at least one vertex 996 and unit cell 840-3 is connected to unit cell 840-2 at at least one vertex 996, as described above.

Unlike the wicking structures 620 and support structures 630 of FIGS. 6-1 through 6-3, the wicking structures 920 and support structures 930 may use two different kinds of unit cells 740, 840. In other embodiments, more or fewer types of unit cells may be used. For example, a support structure 930 may include a unit cell 540 of FIGS. 5-1 through 5-5, a unit cell 740 of FIGS. 7-1 through 7-5, a unit cell 1140 of FIGS. 11-1 through 11-4, other unit cells, or combinations thereof.

Figures 1, 10:
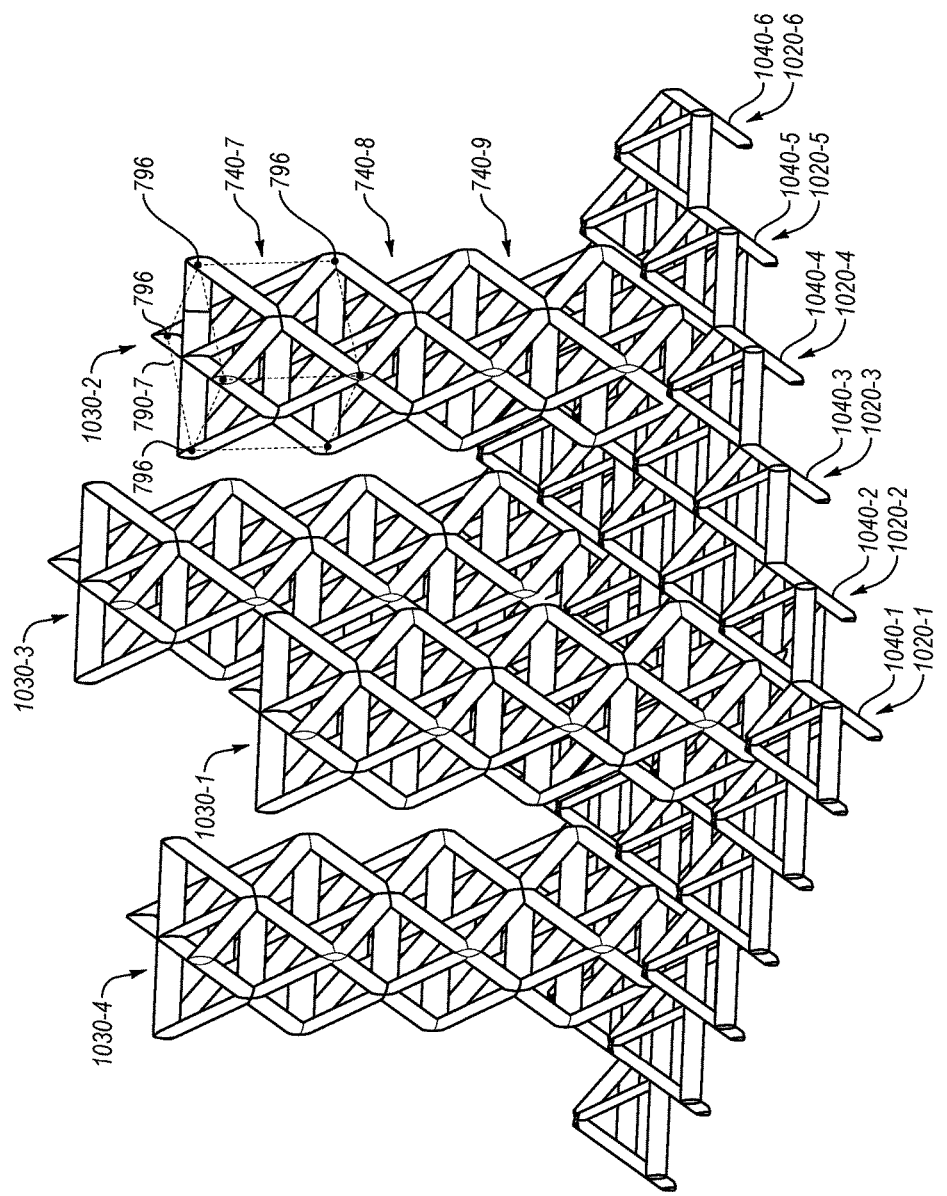
Figures 2, 10:
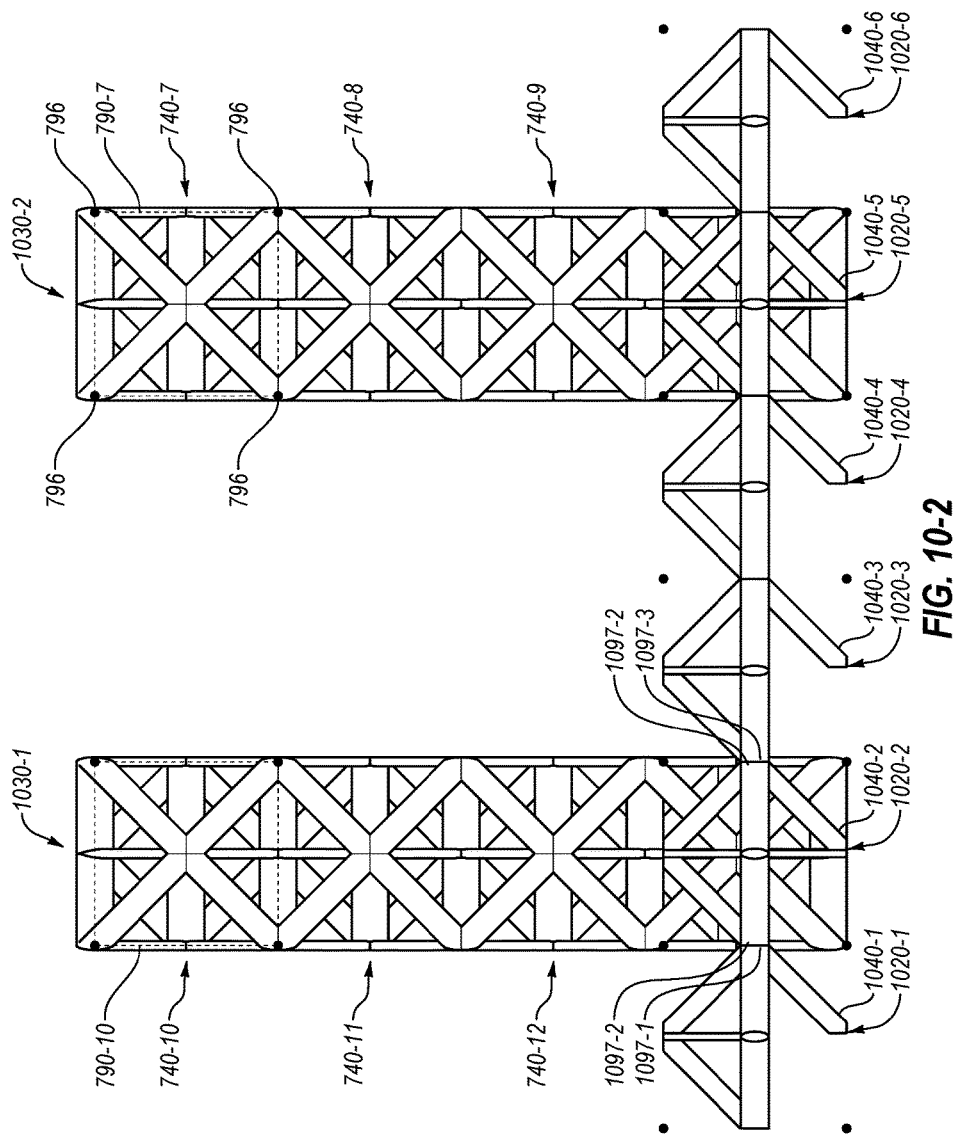

FIGS. 10-1 and 10-2 illustrate a fifth embodiment of a plurality of wicking structures 1020 and a plurality of support structures 1030. The plurality of wicking structures 1020 may form a wick of a thermal management device. The plurality of support structures 1030 may form the support structure for a thermal management device and.

As shown, unit cells 1040 may be open cells. Unit cells 1040 may be modified versions of the unit cell 840 of FIGS. 8-1 through 8-5. In other words, as shown, a unit cell, such as unit cell 1040, may only include a portion of a unit cell, such as unit cell 840. For example, one or more struts 842 may be removed from the unit cell 840.

Figures 1, 11:
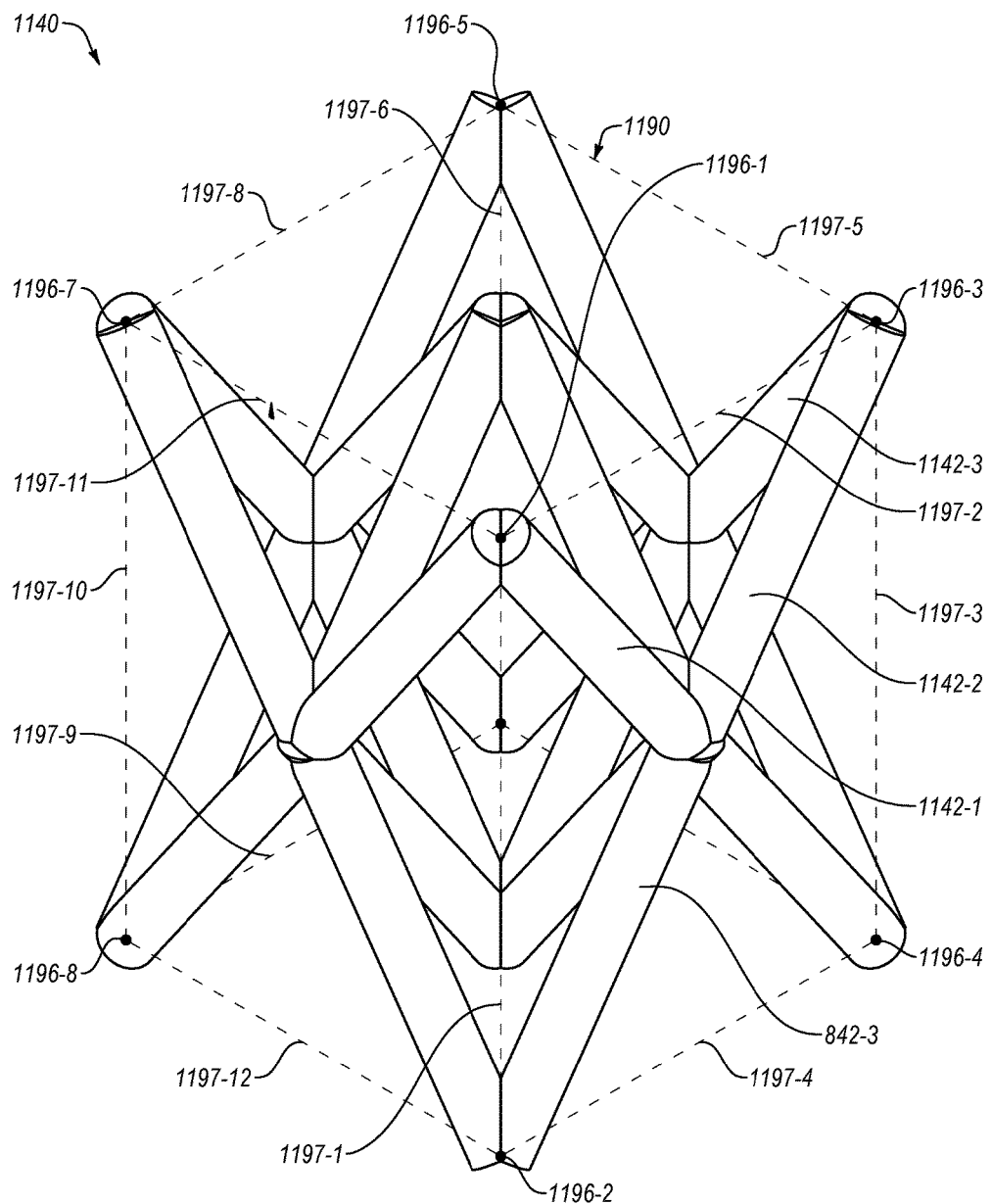
Figures 2, 11:
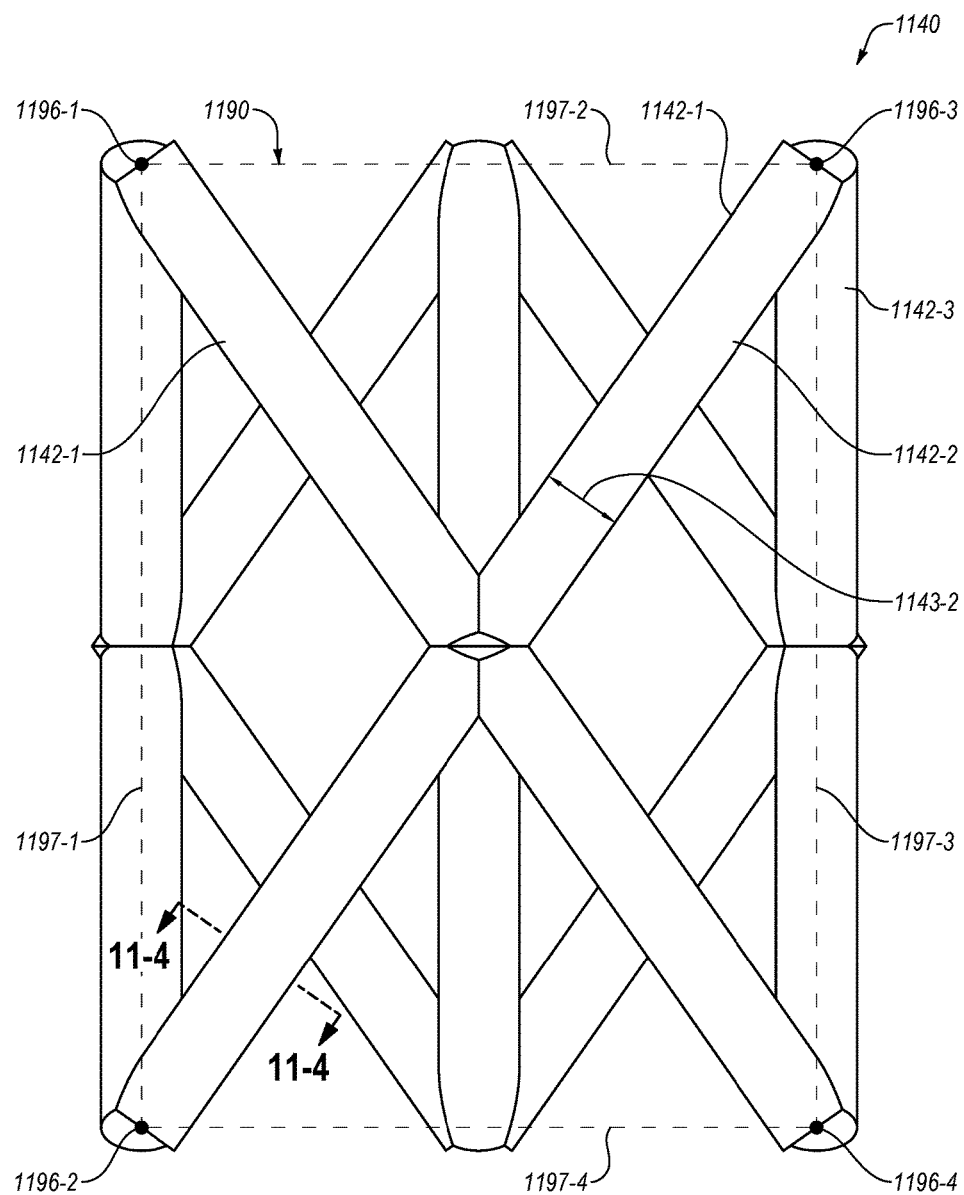
Figures 3, 11:
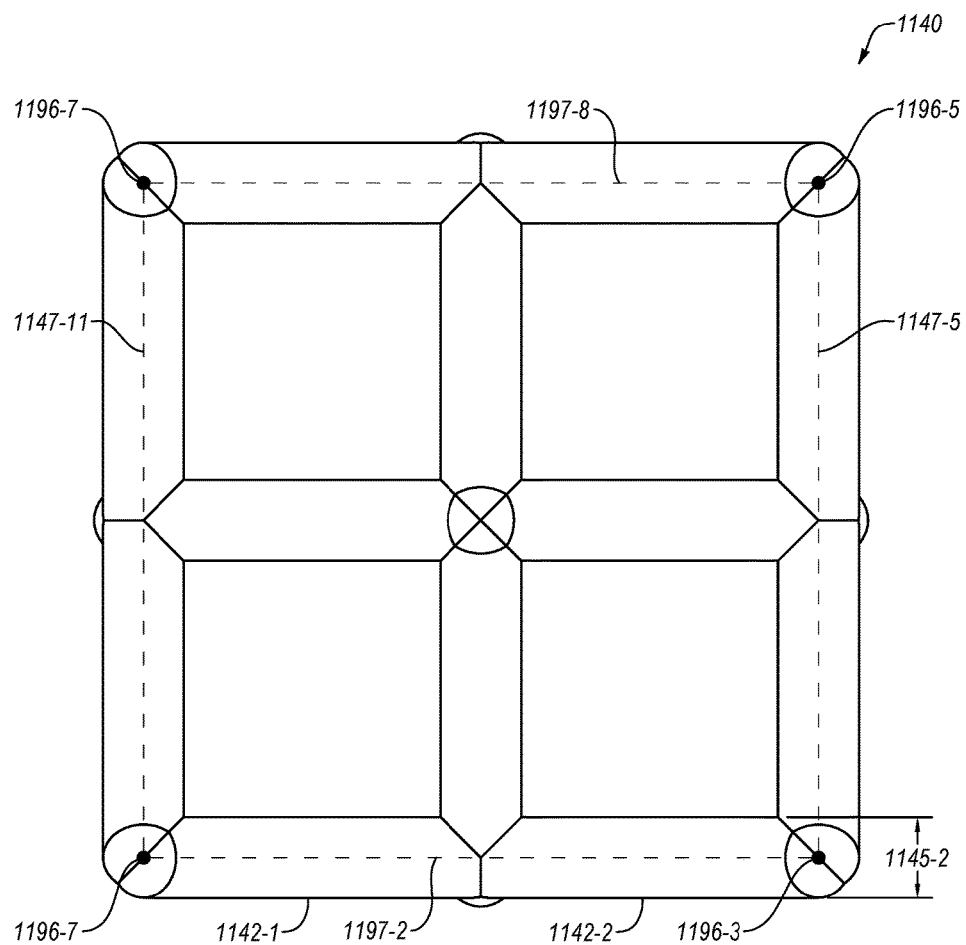
Figures 4, 11:
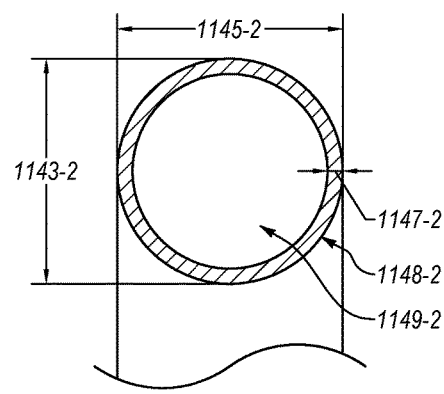

FIGS. 11-1 through 11-4 illustrate various views of a sixth embodiment of a unit cell 1140. For ease of description, like numbers will be used for like features. Components (e.g., struts, vertices, interfaces, other components) of or features of one or more of the embodiments of unit cells of FIGS. 5-1 through 11-3 may be included in one or more other embodiments of the wicking structures and/or support structures of FIGS. 5-1 through 11-3. All combinations and permutations are contemplated and may be claimed.

The unit cell 1140 may be used as a wicking structure (e.g., wicking structure 420) and/or as a support structure (e.g., support structure 430). The unit cell 1140 defines a volume 1190. The volume 1190 may have a height 1191, a width 1192, and a depth 1193. One or more of the height 1191, width 1192, and depth 1193 may be greater than 50 microns, between 50 microns and 200 microns, between 100 microns and 1.0 millimeter, less than 1.0 millimeter, or any value or range therebetween.

The volume 1190 may include one or more vertices 1196. Vertices 1196 of one unit cell 1190 may intersect with vertices 1196 of one or more other unit cell volumes 1190. Interfaces 1197 (e.g., edges) may be formed between the vertices 1196. Interfaces 1197 of one unit cell 1140 may intersect with interfaces 1197 of one or more other unit cells 1140. The unit cell 1140 may be formed with respect to a plurality of struts 1142. The struts 1142 may cooperate to form a first shape and the unit cell 1140 may have a second shape.

The struts 1142 may have a major dimension 1143 and a minor dimension 1145 in a cross-section perpendicular to a longitudinal axis of the strut 1142. For example, as shown in FIG. 11-4, the second strut 1142-2 has a major dimension 1143-2 and a minor dimension 1145-2, which are the same (e.g., the second strut 1142-2 is circular in cross-section). The major dimension 1143 and/or minor dimension may be greater than five microns, between five microns and twenty microns, less than twenty microns, or any value or range therebetween. The major dimension 1143 and the minor dimension 1145 may form a ratio, as described above.

In at least one embodiment, one or more struts 1142 may include a coating 1148 and/or a base material 1149. The coating 1148 may include a thickness 1147, as described above. The base material 1149 and/or coating 1148 may be produced as described above.

The unit cell 1140 illustrated in FIGS. 11-1 through 11-5 may have an effective volume fraction of less than 20%, between 20% and 50%, between 20% and 40%, less than 50%, less than 45%, less than 40%, or any value or range therebetween.

In at least one embodiment, the thermal management device may provide a low-weight, small-footprint solution to spread and transfer heat. At least one embodiment disclosed herein includes multi-scale lattice structures that facilitate lightweight and/or strong wicking and/or supporting structures within vapor chambers, heat pipes, or other thermal management systems.

At least one embodiment described herein improves thermal management device operations by improving the internal wicking structure to achieve more efficient fluid transfer and/or by reducing weight while maintaining structural rigidity.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system, comprising:
   an enclosed housing; and
   a plurality of additively manufactured wick unit cells oriented and within the enclosed housing, each unit cell having a plurality of struts including a shell, wherein one or more of the plurality of additively manufactured wick unit cells have an effective volume fraction of less than 40%.

2. The thermal management system of claim 1, wherein a thickness of the shell is less than 10 angstroms.

3. The thermal management system of claim 1, wherein a thickness of the shell is less than 5 angstroms.

4. The thermal management system of claim 1, wherein one or more of the plurality of additively manufactured wick unit cells have an effective volume fraction of less than 30%.

5. The thermal management system of claim 1, wherein one or more of the plurality of additively manufactured wick unit cells have an effective volume fraction of less than 20%.

6. The thermal management system of claim 1, wherein one or more of the plurality of additively manufactured wick unit cells have an effective volume fraction of less than 10%.

7. The thermal management system of claim 1, wherein the shell is metallic or ceramic.

8. The thermal management system of claim 1, wherein one or more struts of the plurality of struts have a major dimension of less than 30 microns.

9. The thermal management system of claim 1, wherein one or more struts of the plurality of struts have a major dimension of less than 10 microns.

10. The structure thermal management system of claim 1, wherein one or more struts of the plurality of struts have a major dimension of less than 5 microns.

11. A wicking structure for thermal management, comprising:
    a plurality of additively manufactured wick unit cells, each unit cell having a plurality of struts including a shell; and
    a polymeric core filling the shell.

12. A thermal management system, comprising:
    an enclosed housing;
    the plurality of additively manufactured wick unit cells of claim 11 oriented within the enclosed housing, each wick unit cell having a plurality of struts including a metallic shell, wherein a thickness of the shell is less than 10 angstroms; and
    a plurality of additively manufactured support unit cells extending between an upper interface and a lower interface of the enclosed housing, each unit cell having a plurality of struts including a metallic shell, at least one of the plurality of additively manufacture wick unit cells connected to at least one of the plurality of additively manufactured support unit cells, wherein the plurality of additively manufactured wick unit cells have an effective volume fraction of less than 40%, wherein the percentage of the unit cell that includes material is the effective volume fraction.

13. A support structure for thermal management, comprising:
    a plurality of additively manufactured support unit cells, each unit cell having a plurality of struts including a shell, wherein a thickness of the shell is less than 10 angstroms.

14. The support structure of claim 13, wherein a first interface of a first additively manufactured support unit cell is connected to a second interface of a second additively manufactured support unit cell.

15. The support structure of claim 14, wherein a first interface of the second additively manufactured support unit cell is connected to a second interface of a third additively manufactured support unit cell.

16. The support structure of claim 15, wherein a first interface of the third additively manufactured support unit cell is connected to a second interface of a fourth additively manufactured support cell.

17. The support structure of claim 13, wherein one of the plurality of additively manufactured support unit cells has a cross-sectional area of less than 0.25 mm$^2$.

18. The support structure of claim 13, wherein one of the plurality of additively manufactured support unit cells has a cross-sectional area of less than 0.50 mm$^2$.

19. The support structure of claim 13, wherein one of the plurality of additively manufactured support unit cells has a major dimension of less than 0.5 mm.

20. The support structure of claim 13, wherein one of the plurality of additively manufactured support unit cells has a major dimension of less than 1.0 mm.

\* \* \* \* \*